United States Patent

Yamagata et al.

[11] Patent Number: 5,828,127
[45] Date of Patent: Oct. 27, 1998

[54] SEMICONDUCTOR SUBSTATE WITH IMPROVED THERMAL CONDUCTIVITY

[75] Inventors: Shin-ichi Yamagata; Kazuya Kamitake; Yoshishige Takano, all of Itami, Japan

[73] Assignee: Sumitomo Electric Industries, Ltd., Japan

[21] Appl. No.: 557,552

[22] Filed: Nov. 14, 1995

[30] Foreign Application Priority Data

Nov. 15, 1994 [JP] Japan .................................. 6-280726
Apr. 19, 1995 [JP] Japan .................................. 7-093302
Jun. 7, 1995 [JP] Japan .................................. 7-163139
Oct. 4, 1995 [JP] Japan .................................. 7-284483

[51] Int. Cl.$^6$ .......................... H01L 23/36; H01L 23/14; H01L 23/373; H01L 23/28
[52] U.S. Cl. .......................... 257/706; 257/765; 257/675; 257/741; 257/747; 257/712
[58] Field of Search .................................. 257/706–733, 257/675, 765, 741–748

[56] References Cited

U.S. PATENT DOCUMENTS

| | | | |
|---|---|---|---|
| 4,274,106 | 6/1981 | Ohdate ............................... | 257/722 |
| 4,926,242 | 5/1990 | Itoh et al. ............................ | 257/722 |
| 5,055,914 | 10/1991 | Shimizu et al. ...................... | 257/722 |
| 5,345,108 | 9/1994 | Kikkawa ............................ | 257/758 |
| 5,386,339 | 1/1995 | Polinski, Sr. ........................ | 257/726 |
| 5,402,004 | 3/1995 | Ozmat et al. ....................... | 257/720 |
| 5,489,802 | 2/1996 | Sakamoto et al. .................. | 257/719 |

FOREIGN PATENT DOCUMENTS 0205055   8/1989   Japan .

OTHER PUBLICATIONS

Patent Abstracts of Japan, JP63134694, Sumitomo Electric Jun. 7, 1988 (1 pg.).
Patent Abstracts of Japan, JP6188334, Kyocera, Jul. 8, 1994 (1pg) M. Hiroshi.

*Primary Examiner*—Sara W. Crane
*Assistant Examiner*—Alexander Oscar Williams
*Attorney, Agent, or Firm*—Bierman, Muserlian and Lucas LLP

[57] ABSTRACT

A material for a semiconductor substrate comprising an aluminum-silicon alloy containing from 50% to 80% by weight of silicon and having a thermal conductivity of 0.28 cal/cm.sec.° C. or higher, a coefficient of thermal expansion of $12 \times 10^{-6}/°$ C. or smaller and a density of 2.5 g/cm$^3$ or lower. This material is produced by molding an Al—Si alloy powder, which has been obtained through rapid solidification by atomization, to form a compact and then consolidating the compact by means of forging, sintering, etc. The substrate material may have an Al or Al alloy covering layer at least one surface thereof and, further, as necessary, an insulating or plating layer on the covering layer. The thus obtained substrate material is lightweight and has a suitable coefficient of thermal expansion for a substrate as well as a high thermal conductivity. Therefore, a semiconductor device with high performance and reliability can be obtained using such substrate material.

60 Claims, 12 Drawing Sheets

SEMICONDUCTOR SUBSTATE WITH IMPROVED THERMAL CONDUCTIVITY

BACKGROUND OF THE INVENTION

1. Field of the Invention

The present invention relates to a material for a substrate used for components of a semiconductor device such as a heat sink, a radiator board and a housing, a process for producing the same, and a semiconductor device using the subject material.

2. Description of the Prior Art

It is required for materials for a substrate of a semiconductor device not to cause distortion from thermal stress on or at an interface when they are assembled with other members for the device. Therefore, it is necessary that the coefficient of thermal expansion of the semiconductor substrate material is not so different from that of the semiconductor device or other materials to be assembled therewith.

More specifically, it is required that the coefficient of thermal expansion of the semiconductor substrate material be close to that of the semiconductor device of silicon (Si) or gallium-arsenic (GaAs) and be between that of the semiconductor device and that of aluminum (Al) or copper (Cu) which are used as materials for the radiator board. The coefficients of thermal expansion for Si, GaAs, Al and Cu are 4.2, 6.5, 23.5 and 17, respectively, in a unit of $10^{-6}/°$ C.

Recent trend for larger semiconductor devices and higher integration level requires materials for a semiconductor substrate to have a heat sink function in order to effectively remove the thermal energy released from the semiconductor device and thus materials for a semiconductor substrate with high thermal conductivity are in demand.

With this respect, there has been increasing demands especially for the materials for a semiconductor substrate having a thermal conductivity of 0.28 cal/cm.sec.° C. or higher and having a coefficient of thermal expansion of $12 \times 10^{-6}/°$ C. or smaller, which is between that of Al or Cu and that of Si or GaAs.

Conventionally, Cu—Mo alloys and Cu—W alloys have been used widely as materials for a semiconductor substrate with high thermal conductivity and low coefficient of thermal expansion., However, these alloys have a relatively high specific gravity of 9–17 g/cm$^3$ and are thus disadvantageous for use in portable devices and in the field of spacecraft technology where lighter materials are required. For the above applications, a material for a substrate with a density of 3.0 g/cm$^3$ or lower as aluminum alloys and preferably 2.5 g/cm$^3$ or lower.

An Al—Si alloy with a 50–80% Si content by weight is proposed as a material for lightweight semiconductor substrates for the above applications in Japanese Patent Laid-open No. 1-205055. The properties of this aluminum alloy is as follows: density of 2.3–2.5 g/cm$^3$, coefficient of thermal expansion of $6-12 \times 10^{-6}/°$ C. and thermal conductivity of 0.2–0.27 cal/cm.sec.° C.

The above mentioned Al—Si alloy with 50–80% Si content by weight proposed in Japanese Patent Laid-open No. 1-205055 satisfies the above requirements in density and coefficient of thermal expansion but fails to meet the thermal conductivity requirement of at least 0.28 cal/cm.sec.° C.

While there is a trend for larger semiconductor equipment as mentioned above, there is also demand for compact, lightweight and inexpensive semiconductor products of higher integration level.

A Cu—W alloy with 10% Cu content by weight, which is most widely used has a thermal conductivity of approximately 0.50 cal/cm.sec.° C. and a coefficient of thermal expansion of approximately $7 \times 10^{-6}/°$ C. The coefficient of thermal expansion can be improved to be within a satisfactory range by means of increasing the amount of Si contained therein. The higher content of Si deteriorates the thermal conductivity. It cannot even reach the required level of 0.30 cal/cm.sec.° C. or higher. This has been a serious problem to overcome.

Also, with the Al—Si alloys it is necessary to make the diameter of deposited primary Si crystals be as small as possible and to make them distribute as uniform as possible in order to increase their thermal conductivity. For this purpose, used is the method of atomizing molten alloy and rapidly solidifying it. With the higher Si content, a crucible for the molten alloy and a spray nozzle used are required to have lower reactivity with the molten alloy, better heat resistance and thermal shock resistance because Si is higher in melting point of 1,430° C., as compared with 660° C. of Al.

It is also necessary to control the final dimension with a partial polishing process since the Al—Si alloy is more easily chipped with the conventional cutting process as the amount of Si increases and especially when the Si content by weight exceeds 50% as in this case.

In addition to the above considerations concerning the properties and compositions of the material for the substrate, the following points are to be considered in order to use these materials for a substrate as components of the semiconductor device.

The Al—Si alloy with a 50–80% Si content by weight proposed in the above mentioned Japanese Patent Laid-open No. 1-205055 has superb properties as a material for a semiconductor substrate which needs to be lightened. However, its surface needs to be treated with alumite for better corrosion resistance and imparting insulating property or be plated for better corrosion resistance and imparting brazing easiness in order to use the resultant product as a semiconductor substrate.

However, the alumite treatment can only be applied on a surface where aluminum is exposed. Even with the alumite treatment, pores are formed in the alumite layer on the exposed silicon surface of the above mentioned Al—Si alloy. Silicon on the surface can be removed by such methods as etching in order to avoid the pores in the alumite layer. There is, however, a disadvantage that this process results in rough surface quality and reduces the corrosion resistance and insulating property of the resultant alumite layer.

With this respect, an alternative method of the alumite treatment of the Al—Si alloy has been proposed in which the formation of the alumite treated layer is followed by the formation of an insulating resin film on it by means of electrodeposition coating, as disclosed in Japanese Patent Laid-open No. 62-88399. Also Japanese Patent Laid-open No. 62-18978 proposes a process of forming an epoxy resin layer on the alumite treated layer. However both methods require two steps of surface treatment process and are not desirable considering adhesion of each layer and their cost.

As for the process of plating the Al—Si alloy, it is difficult to form a uniform layer of plating on silicon and aluminum since they are quite different in ionization tendency. In addition, the plating layer does not adhere well to silicon and causes problems in corrosion resistance and brazing applicability. Hence Japanese Patent Laid-open No. 1-205555 discloses a process of plating the Al—Si alloy in which a chemical plating layer of 0.1–0.2 µm is formed first, and then an electroplating layer of 0.5–3 µm is formed thereon, following which as the upper most layer a gold plating layer of 0.1–3 µm is formed. However, this method has an economical problem since it requires three steps of treatment.

Japanese Patent Laid-open No. 2-119249 proposes a material for a semiconductor device which is composed of an aluminum alloy material integrally formed by joining two different aluminum alloys: a portion of a first aluminum alloy having an average coefficient of thermal expansion of $17 \times 10^{-6}/°$ C. or smaller and another portion of a second aluminum alloy having a thermal conductivity higher than that of the first aluminum alloy.

However, even if an Al—Si alloy with 50% or lower Si content by weight whose surface can easily be treated, is used as the second aluminum alloy, there arises a problem in surface treating the first aluminum alloy part, when an Al—Si alloy with 50% or higher Si content by weight used as the first aluminum alloy to satisfy the requirements of lightweight, high thermal conductivity and low coefficient of thermal expansion for use in portable device and in spacecraft technology.

With respect to the above, an object of the present invention is to overcome the above mentioned problems while considering the circumstance regulated by the conventional methods and to provide a material for a semiconductor substrate made of an Al—Si alloy suitable for use in compact device and spacecraft technology with a density of 2.5 g/cm$^3$ or lower, a coefficient of thermal expansion of $12 \times 10^{-6}/°$ C. or smaller and a thermal conductivity of 0.28 cal/cm.sec.° C. or higher. Another object is to provide a surface-treated substrate material by pre-forming a layer of Al or Al alloy on the foregoing substrate material and then surface-treating the layer with alumite (anodic oxide coating), plating or the like, for the purpose of imparting corrosion resistance, insulating properties and brazability to the substrate. Yet another object is to provide a process for producing these materials for a semiconductor substrate at a low cost, a high precision and an efficient productivity rate and to provide high performance and highly reliable semiconductor device using the substrate.

SUMMARY OF THE INVENTION

In order to achieve the above mentioned objects, a material for a semiconductor substrate according to the first aspect of the present invention is a material for a semiconductor substrate having a thermal conductivity of 0.28 cal/cm.sec.° C. or higher, preferably of 0.30 cal/cm.sec.° C. or higher, a coefficient of thermal expansion of $12 \times 10^{-6}/°$ C. or smaller, and preferably of $10 \times 10^{-6}/°$ C. or smaller, and a density of 2.5 g/cm$^3$ or lower, the material comprising an aluminum-silicon alloy containing from 50% to 80% by weight of silicon.

A material for a semiconductor substrate according to the second aspect of the present invention is the one having an aluminum covering layer of 5–500 µm thick comprising aluminum or an aluminum alloy formed on at least one surface of the material for a semiconductor substrate according to the first aspect. Further, the material may also have an insulating layer or a plating layer on the outermost surface of the aluminum covering layer. Further, in accordance with the present invention, there is provided a semiconductor device with the above mentioned material for a semiconductor substrate.

The semiconductor substrate material of the Al—Si alloy according to the first aspect of the present invention is provided through the following process.

A first process is a production process of the semiconductor substrate material, the process comprising: providing a molten aluminum-silicon alloy containing 50% or less by weight of silicon; rapidly solidifying by atomizing the molten alloy to form aluminum-silicon alloy powder; adding and mixing silicon powder to and with the aluminum-silicon alloy powder to provide mixed powders containing from 50% to 80% by weight of silicon; compression molding the resultant mixed powder to form a compact; and consolidating the compact.

A second process is a production process of the semiconductor substrate material which comprises providing a molten aluminum-silicon alloy containing 50% to 80% by weight of silicon; rapidly solidifying by atomizing the molten alloy to form an aluminum-silicon alloy powder; compression molding the aluminum-silicon alloy powder to form a compact; and consolidating the compact.

The advantage of the first process is that relatively inexpensive crucibles and atomization nozzles can be used since the temperature for melting the Al—Si alloy with a smaller Si content of 50% or less is lower than that in the second process. However, an additional stage of adding and mixing Si powder is required after the atomization in the first process. The advantage of the second process is that a highly pure Al—Si alloy powder with a high Si content of 50–80% by weight can be produced through a single stage of atomization. However, since the melting temperature before atomizing is higher than in the first process, it is necessary to use high quality crucibles and nozzles made of such a material as high purity Al$_2$O$_3$ having low reactivity with the alloy, high heat resistance and thermal shock resistance.

A typical solidification rate is $10^{2°}$ C./sec or higher and preferably $10^{3°}$ C./sec in the first process and, higher than $10^{3°}$ C./sec in the second process. In both processes, the consolidation after the molding is done either by pre-heating the compact and then forging it in a heated forging die or by heating the compact in a nitrogen atmosphere and sintering it.

The above is the outline of the first and second processes for producing the semiconductor substrate materials according to the present invention. Furthermore, there is the third process in which the forging pressure is reduced by raising the forging temperature in the consolidation step in the first and second processes. With this process, there is provided an Al—Si alloy material having a good heat radiation capability with a thermal conductivity of 0.30 cal/cm.sec.° C. or higher.

The second material of the Al—Si alloy for the semiconductor substrate according to the present invention, which comprises the above mentioned aluminum covering layer, is provided by the process described below.

More specifically, in the above-mentioned first or second process, the step of compression molding the mixed powders or the aluminum-silicon alloy powder containing from 50 to 80% by weight of silicon to form a compact further comprises arranging a precursor layer so as to cover at least one surface of the compact to be formed, the presursor layer being to be served as the aluminum covering layer in the subsequent consolidation, and consolidating the compact to form the aluminum covering layer (5–500 µm in thickness) of aluminum or an aluminum alloy of at least one surface of the resultant consolidated body.

The aluminum coating layer of aluminum or aluminum alloy may be formed on at least one surface of the compact after consolidating the compact of the mixed powder or the aluminum-silicon alloy powder containing from 50% to 80% by weight of silicon in the first or second process. In the present invention, for the use in a semiconductor device, an insulating layer or a plating layer may be provided on the outermost surface of the aluminum covering layer so formed.

The first and second material for a semiconductor substrate provided by the present invention as mentioned above can be chosen according to the function of material and can be integrated therein with the conventional assembly procedures to manufacture unconventionally lightweight and high performance semiconductor device.

DETAILED DESCRIPTION OF THE PREFERRED EMBODIMENTS

The thermal conductivity of aluminum of 0.5 cal/cm.sec.° C. is outstanding but its coefficient of thermal expansion of $23.5 \times 10^{-6}/°$ C. is extremely large and its density of 2.7 g/cm$^3$ is also too high. On the other hand, silicon is small in coefficient of thermal expansion, $4.2 \times 10^{-6}/°$ C., and is low in density, 2.3 g/cm$^3$. The thermal conductivity thereof is relatively high, 0.3 cal/cm.sec.° C. It is possible to reduce the density to 2.5 g/cm$^3$ or lower and the coefficient of thermal expansion to $12 \times 10^{-6}/°$ C. or smaller by means of incorporating 50% or more by weight of silicon into aluminum. It is, however, difficult to raise the thermal conductivity to 0.28 cal/cm.sec.° C. or higher as disclosed in Japanese Patent Laid-open No. 1-205055.

The present inventors investigated the reason why it was impossible to increase the thermal conductivity of the Al—Si alloy, and came to the following conclusion. When rapidly solidifying a molten Al—Si alloy with more than 50% Si content by weight using only the atomization process for the production of raw material powders, the only way is to raise the melting temperature since the amount of Si, which has a higher melting point than that of aluminum, is large. Therefore when the general crucibles or nozzles made of oxide or graphite used for conventional Al—Si alloy with a low Si content is used, the purity of the molten alloy is lowered by the invasion of oxides of the crucibles or nozzles or impurities such as silicon carbide (SiC) generated by the reaction of oxide or graphite with silicon since the crucibles or nozzles are easily attacked by the molten alloy. Also, due to the high temperature of the molten alloy, the time required for solidification is increased and, as a result, there may arise problems of the production of coarse silicon, uneven dispersion of the coarse silicon, uneven grain size and the creation of pores in the alloy grains which remain even after the powder is consolidated. Since the increased amount of silicon is solid dissolved in aluminum, the electrons and the oscillation of the lattice, which transfer the heat of the aluminum, are easily scattered. These are considered to be the main causes.

Figure 1:
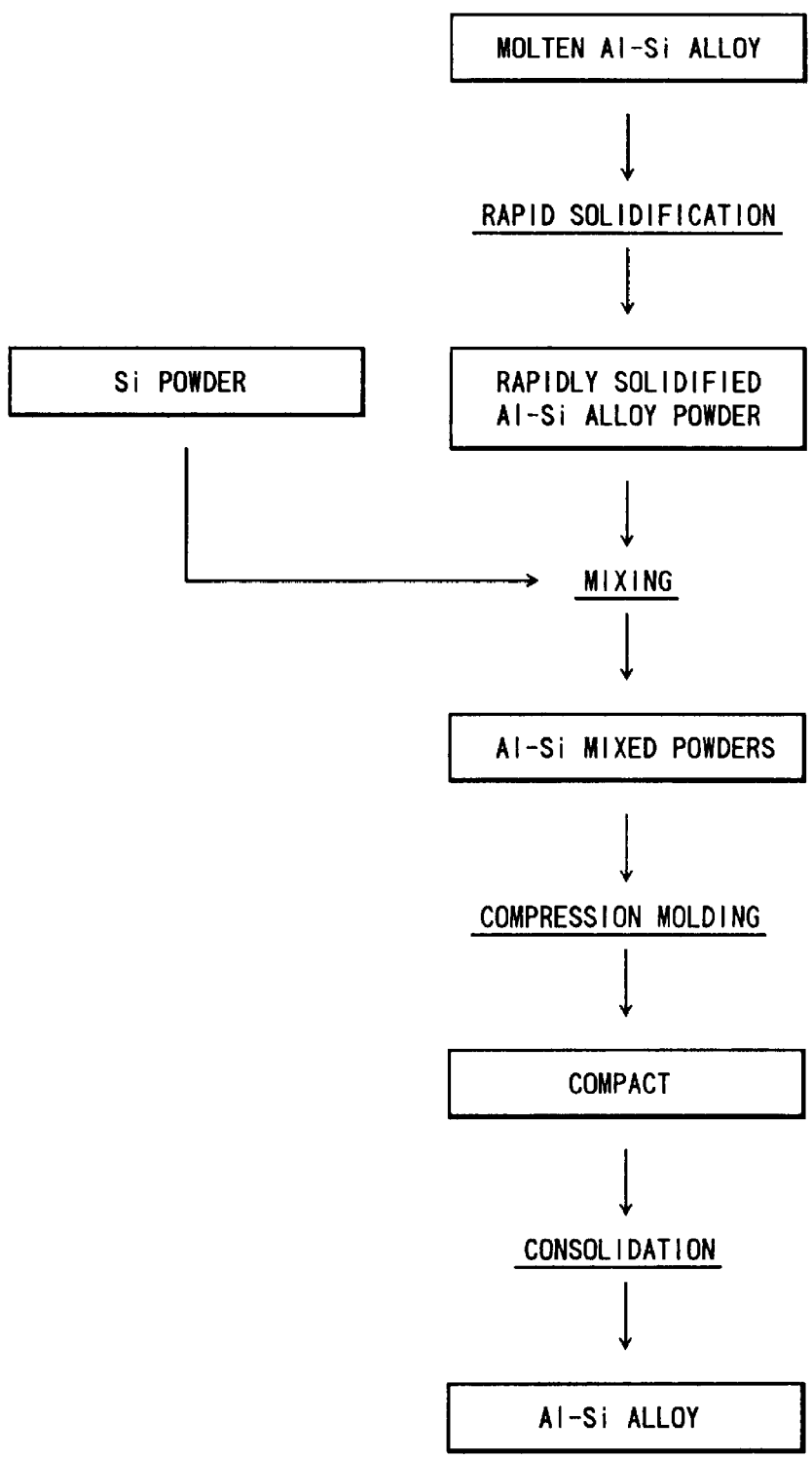
FIG. 1 is a flow diagram showing a first process for producing a material for a semiconductor substrate according to one embodiment of the present invention.

Hence, in the first process of the present invention in which the general crucibles and nozzles are used, a molten Al—Si alloy with the Si content of 50% or smaller is rapidly solidified by atomizing to form Al—Si alloy powder and then the insufficient amount of Si is supplemented by adding Si powder to this rapidly solidified Al—Si alloy powder as shown in the flow chart of FIG. 1.

According to this first process, it is possible to suppress the inclusion of constituent materials of the crucible into the molten Al—Si alloy or the formation of SiC by tine reaction between carbon in the crucible and Si by regulating the amount of Si to 50% or less by weight in the molten Al—Si alloy to be atomized. This process also prevents agglutination of the alloy onto the spray nozzle and maintains the useful life of such parts. Furthermore, this process allows the production of solidified alloy powder containing 1% or less by weight of oxygen and 1% or less by weight of impurity other than oxygen. Accordingly, the so obtained rapidly solidified Al—Si alloy powder becomes free from the above mentioned problems, allowing the resultant semiconductor substrate material to have the thermal conductivity of 0.28 cal/cm.sec.° C. or higher.

The size of Si crystals crystallized or precipitated in the aluminum matrix depends largely on the solidification rate. That is, the Si crystal becomes coarse when the solidification rate of the molten alloy is below $10^{2°}$ C./sec and therefore the formability of the powder and the machinability are lowered. Hence it is desirable that the solidification rate be at least $10^{3°}$ C./sec. Especially, when the solidification rate is higher than $10^{3°}$ C./sec even the maximum size of the primary crystals is only 30 $\mu$m which has absolutely no effect on the formability or machinability.

It is also possible to add elements other than Si to the molten Al—Si alloy depending on the needs. For example, elements with stronger oxidizing power than Al such as magnesium (Mg) destroy the oxide film on the surface of the rapidly solidified Al—Si alloy powder and, thus, have an effect of reinforcing the adhesion between grains. Iron (Fe), nickel (Ni), etc react with Al to form intermetallic compounds which are dispersed among the powder and exhibit an effect of preventing the grain growth of Si during the hot consolidation.

The rapidly solidified Al—Si alloy powder obtained by the above process contains 50% at most by weight of Si. Therefore, Si powder is added to and mixed with the Al—Si alloy powder so that the final composition will have a 50–80% Si content by weight as shown in FIG. 1. If the Si content in the Al—Si mixed powders is higher than 80% by weight, the thermal conductivity of the final Al—Si alloy will be below 0.28 cal/cm.sec.° C.

The surface of each grain of the rapidly solidified Al—Si alloy powder is aluminum so the adherence between the grains are strong. Since silicon grains are hard, they will result in weak adherence there between. Therefore, if Si powder is added in an amount more than 60%, based on the total weight of the Si powder and the rapidly solidified Al—Si alloy powder, adherence between grains will be weakened and its compact will chip easily. Hence in the first process of the present invention, the addition of Si should be adjusted to provide an Si content of 80% by weight at the maximum in the resultant powder mixture from this point of view also.

It is possible to improve the formability to some extent by adding some binding agent. However, even in this case, when the Si powder is added in an amount exceeding 60%, based on the combined weight of the Si powder and the rapidly solidified Al—Si alloy powder, a large amount of binding agent is required and the binder may remain even after the heat removal treatment. This will have an undesirable effect in the quality of the final semiconductor substrate material.

A process of simply mixing Al powder and Si powder together without using the rapidly solidified Al—Si alloy powder can be considered. However in order to make the Si content in the mixed powder be more than 60%, the amount of Si powder should be more than 60% of the mixed powder and the strength of the compact will be lowered for the same reason mentioned above.

It is desirable that the Si powder to be added have a maximum grain size of 100 $\mu$m or smaller and an average grain size of 30 $\mu$m or smaller for thorough mixing and machinability of the alloy. There is also no need to use any special device for mixing. They can easily be mixed uniformly with such device as the usual kneader, mixer or ball mill.

The mixed powder obtain by the above process is compression molded as shown in FIG. 1. It is desirable that the pressure of the compression molding be 2 t/cm$^2$ or higher. If the pressure is below 2 t/cm$^2$, adherence between grains in the compact will be weak and the resulting compact will be prone to chipping.

Then, the compact is consolidated to remove internal pores and improve the thermal conductivity and airtightness. Consolidation is typically done by forging or sintering but other processes such as hot extrusion may be applied. When consolidating the compact by forging, typically the compact is pre-heated to 400° C. or higher and it is forged in a forging die at a die temperature of 150° C. or higher and a forging pressure of 4 t/cm$^2$ or higher. If the die temperature is below 150° C., densification of the surface layer of the forged body can not be attained.

When consolidating the compact by sintering, the compact is sintered in a nitrogen atmosphere at 500°–570° C. If the sintering temperature is below 500° C., sintering will not be proceeded and if it is over 570° C., deformation may occur since the temperature is nearing the melting point of Al. In order to promote sintering by creating only nitride on the powder surface, it is necessary to use an atmosphere consisting mainly nitrogen and the partial pressure of nitrogen should be 0.95 atm or higher. As for the pressure of the sintering atmosphere, sintering can be accelerated by increasing the pressure but normal atmospheric pressure is sufficient. It is desirable that pores be removed by sizing or coining at a pressure of 4 t/cm$^2$ or higher after consolidation by sintering.

A thermal conductivity of 0.28 cal/cm.sec.° C. or higher is possible with the forged or sintered body made of Al—Si alloy obtained by the process mentioned above and shown in FIG. 1 since the amount of impurities, pores and solid solution of silicon in the aluminum are low and, thus, dispersion of electron and vibration of lattice, which conduct heat, are suppressed in the above forged or sintered bodies as compared with these prepared using, as material powders conventional rapidly solidified Al—Si alloy powder, with 50–80% Si content by weight.

The forged or sintered body of Al—Si alloy obtained by the above process can be used as a semiconductor substrate as is or after it is processed or its surface is treated, if necessary, to suit its application. For example, if it is to be used as a semiconductor substrate or a package, it is subjected to the following treatments to improve the wettability with solder or glass. An Au- or Ni-plating layer is formed directly onto at least one surface where surface treatment is required; or, after forming an Al or Al alloy layer on such a surface, the plating layer is formed onto the outermost surface of that Al or Al alloy layer. Alternatively, if insulation is required, a surface layer of insulator, of AlN, $Al_2O_3$, $SiO_2$ or the like is to be formed directly on at least one surface where the treatment is required or a layer of Al or Al alloy is formed beforehand on at least one such surface and then such an insulating layer can be formed on the outermost surface of that Al or Al alloy layer. The insulating layer such as of AlN can be easily formed by nitriding or of $Al_2O_3$ can be formed easily by anodic oxidation treatment since the surface to be treated is aluminum base in either case where the insulating layer is formed directly or indirectly after the Al or Al alloy layer is formed.

Figure 2:
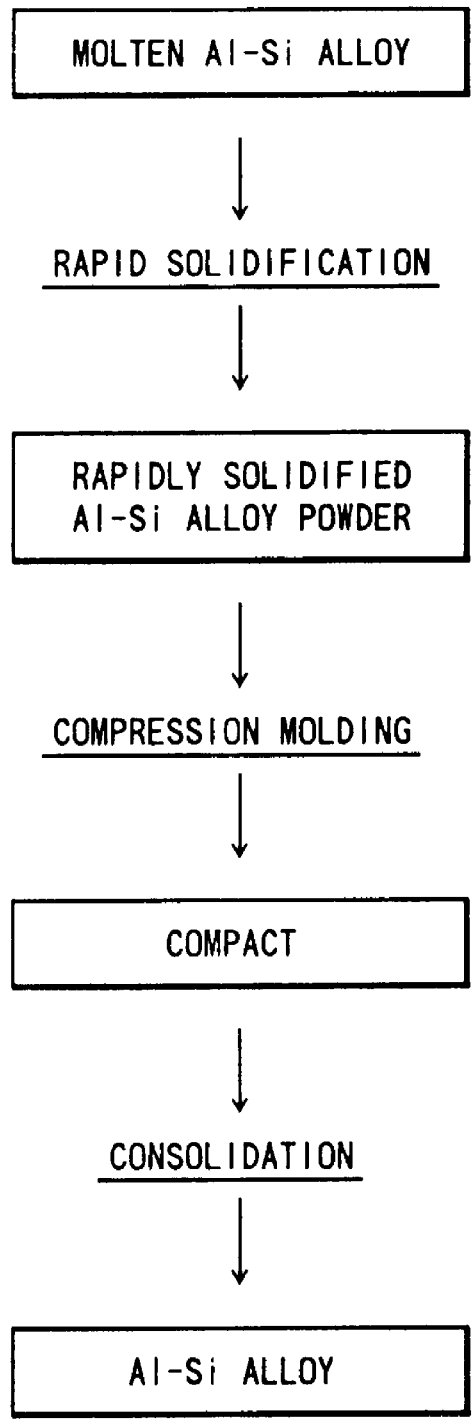
FIG. 2 is a flow diagram showing a second process for producing a material for a semiconductor substrate according to another embodiment of the present invention.

The second process of manufacturing the Al—Si alloy material for a substrate according to the present invention will be explained next. According to this process, the amount of Si content in the molten Al—Si alloy to be used in atomization can be 50–80% by weight from the beginning as shown in the flow chart of FIG. 2. Even if the amount of Si content exceeds 50% by weight, the amount of impurities, oxygen, and the Si grain size and the even dispersion of Si grains in the rapidly solidified powder can be kept at the same levels as those in the first process mentioned above by properly selecting higher quality materials with low reactivity to the molten alloy, high heat resistance and high thermal shock resistance as the materials for the crucible and the nozzle, within which the molten alloy flows, as compared with the ones used in the first process. It is also advantageous compared to the first process in that the step of adding and mixing Si powder after the atomization can be omitted as shown in FIG. 2.

The production of powder by rapid solidification according to the second process will be detailed below. As mentioned previously, for the Al—Si alloy substrate material, it is necessary to eliminate the heat dispersion factors within the alloy as much as possible to attain a thermal conductivity of 0.28 cal/cm.sec.° C. or higher, in addition to controlling the amount of silicon in the alloy. Especially, the effects of impurities and pores in the alloy are large and the two factors must be reduced. Therefore in the second process, it is necessary to use crucibles and nozzles made of materials which do not react easily with the molten alloy and also have high heat resistance and thermal shock resistance since the temperature of the molten alloy will be quite high due to the increased Si content. For example, it is necessary to use such materials as $Al_2O_3$ of at least 90% purity, stabilized $ZrO_2$, AlN, $Si_3N_4$ or BN. Composite materials constituted of the above and other constituents may be used or crucibles or nozzles with their internal surface coated with the above materials may be used.

Also, in the second process, the medium for atomizing, the manner of the atomization and the condition of the atomization are selected as follows. Atmosphere or inert gas has been typically used as the medium to atomize molten alloy into powder in producing rapidly solidified Al—Si alloy powder. In a rapid solidification process using such gas, namely gas-atomization, the solidification rate is from $10^2$ to $10^{3°}$ C./sec.

However, the size of a Si crystal crystallized or precipitated in the Al matrix of the rapidly solidified Al—Si alloy powder depends largely on the solidification rate. Especially, when the silicon content is 50% or higher by weight, the Si crystal tends to be coarse. And especially when the solidification rate is $10^{3°}$ C./sec or lower, due to the coarse Si crystals, the densification of the alloy is inhibited and pores are created in the alloy. As a result, it is difficult to achieve thermal conductivity of 0.28 cal/cm.sec.° C. or higher.

Furthermore, the melting point of the alloy rises as the amount of silicon content increases since the melting point of silicon is extremely high at 1430° C. while that of aluminum is 660° C. and hence at a solidification rate of $10^{3°}$ C./sec or lower, oxidation is prone to occur even in the internal parts of the alloy during the rapid solidification process. This phenomenon becomes more evident when the silicon content exceeds 50% by weight and has been the cause of hindering the achievement of the thermal conductivity of 0.28 cal/cm.sec.° C. or higher since it promotes creation of oxides and pores in the alloy.

It is possible to prevent the above mentioned oxidation from proceeding into the grain by the use of inert gas as a medium in a sealed atmosphere. However such a manner is not only costly but also impractical since the grain becomes spherical by surface tension by the time it is consolidated and hence its compactibility is deteriorated.

With the present invention, it is possible to limit oxidation to only the surface of the solidified grains and reduce the amount of impurities and pores in the alloy without using the above mentioned manner with inert gas, by raising the solidification rate to higher than $10^{3°}$ C./sec By consolidating the resulting rapidly solidified Al—Si alloy powder, it is possible to produce a semiconductor substrate material with thermal conductivity of 0.28 cal/cm.sec.° C. or higher.

Water atomizing, rotary-disc atomizing and twin roller processes are examples of rapid solidification processes in which solidification rate of higher than $10^{3°}$ C./sec is possible. Especially, the water atomizing process has a superb mass productivity and has a high ability to pulverize molten alloy into fine powder even with large nozzle caliber and hence it is possible to prevent clogging of the nozzle which occurs frequently in regular gas atomizing process with high temperature molten alloy. Also since the solidification rate is higher than $10^{3°}$ C./sec, the Si crystals in the resulting powder are small and therefore the machinability is not effected. It is however necessary to dry the rapidly solidified powder in order to obtain Al—Si alloy powder by the water atomize process. If the drying temperature is high enough to create vapor, oxidation may occur inside the powder grain. Therefore the drying temperature should be below 100° C.

In the second process of producing the material for a semiconductor substrate of the present invention, suitable crucibles and nozzles have to be selected and then the rapidly solidified Al—Si alloy powder is produced by rapidly solidifying the molten Al—Si alloy with 50–80% silicon content by weight using one of the above mentioned rapid solidification process such as the water atomizing process at a solidification rate of higher than $10^{3°}$ C./sec In order for the thermal conductivity of the rapidly solidified Al—Si alloy powder to be 0.28 cal/cm.sec.° C. or higher, it is desirable that the grain size of Si in the rapidly solidified Al—Si alloy powder be 30 $\mu$m or smaller, the amount of oxygen contained in the rapidly solidified Al—Si alloy powder be suppressed to 1% or less by weight and the amount of impurities contained in the rapidly solidified Al—Si alloy powder other than oxygen be 1% or less by weight. It is also possible as in the first process to add elements other than Si within the range of not lowering the alloy's properties if necessary.

The rapidly solidified Al—Si alloy powder produced by the above mentioned process is to go through the process of compression molding and thereafter as shown in FIG. 2 to be fabricated into an Al—Si alloy substrate material. The conditions of shaping and consolidating after the compression molding process are the same as in the first process.

The forged, sintered body or the like of Al—Si alloy produced by the procedure mentioned above and shown in FIG. 2 is capable of having thermal conductivity of 0.28 cal/cm.sec.° C. or higher since the amount of impurities, pores and solid solution of silicon in the aluminum are small and hence the dispersion of electrons and vibration of lattice, which conduct heat, are small as compared with the body made using, as a material powder, rapidly solidified Al—Si alloy powder with 50–80% Si content by weight which has been produced by the conventional processes. The forged or sintered body of Al—Si alloy produced according to the second process can be used as a semiconductor substrate as is or after it is processed or the surface thereof is surface treated, if necessary, as mentioned in the section for the first process.

The third process of the present invention in which the consolidation process in the first and second processes is improved to enable production of an Al—Si alloy substrate material with even higher thermal conductivity is explained below. An Al—Si alloy material for a substrate with 50–80% Si content by weight with thermal conductivity of 0.28 cal/cm.sec.° C. or higher can be produced by following the basic procedures in the first or second processes as mentioned previously. Furthermore it was discovered that an excellent heat radiation with a thermal conductivity of 0.30 cal/cm.sec.° C. of higher can be achieved by improving the consolidation process by forging.

The following points were revealed by focusing on the fact that distortion of the lattice in the alloy has a lot to do with thermal conductivity. The thermal conductivity of the silicon in the alloy greatly affects the thermal conductivity of the alloy itself since at least half of the ingredient of the alloy in the present invention is silicon. Most of the heat in silicon is conducted by the lattice vibration and if there is any distortion in the lattice, heat is dispersed and thermal conductivity is lowered. Distortion here not only means non-uniformity of distances between atoms but also includes pores, solid solutions and dislocations.

The most commonly used process of measuring the degree of distortion in crystal lattice is to check the peak width of its X-ray diffraction. X-ray diffraction of Cu-K$\alpha$1 ray (wavelength 1.5405 Å) is typically carried out within the range of from 20° to 140° and higher angles are suited for accurate measurement. In aluminum and silicon alloy, the peak readings of the highest angle detected without each others' interference is (531) for silicon and (420) for aluminum.

Many samples were analyzed for various forging conditions conducted in the first and second processes of the present invention and their X-ray diffraction peaks were measured. It became clear that in some cases thermal conductivity can be 0.28 cal/cm.sec.° C. or higher but lower than 0.30 cal/cm.sec.° C. even if the silicon content is 50–80% by weight when the half value width of the peak of silicon (531) exceeds 0.6. Therefore the half value width of the peak of Si (531) at between 110° and 120° by X-ray diffraction (Cu-K$\alpha$1 ray: wavelength 1.5405 Å) is preferably 0.60 or smaller. Furthermore, even if alloys are produced with same composition, density and coefficient of thermal expansion, some of them can have a higher thermal conductivity by reducing the degree of distortion as much as possible.

Since the thermal conductivity of aluminum is also lowered by distortion, it was revealed that the half value width of the peak of aluminum (420) at between 110° and 120° by X-ray diffraction (Cu-K$\alpha$1 ray: wavelength 1.5405 Å) is preferably 0.5° or smaller.

The third process is explained below. The Al—Si alloy powder with 50–80% Si content by weight obtained by the first or second process is used as a material powder for the semiconductor substrate material in the third process of the present invention. It is possible to add other elements to the molten Al—Si alloy within the range of not deteriorating its properties as needed.

In the consolidation of the Al—Si alloy by forging in the first and second process, the powder is molded and the compact is heated to 400° C. or higher, then the compact is forged at a pressure of 4 t/cm$^2$ or higher in a die heated at 150° C. or higher. In this process, however, a crystal lattice is prone to be distorted due to the high pressure of 4 t/cm$^2$ or higher. On the other hand, densification can not be achieved at a pressure of lower than 4 t/cm$^2$.

With this respect, in the third process the compact made of the material powder is heated to at least 550° C. and forged under a pressure less than 4 t/cm$^2$ in a forging die heated to 300° C. or higher. The eutectic point of the Al—Si alloy is 577° C. and the alloy will start to soften at 550° C. Therefore, it is possible to forge the compact at a pressure less than 4 t/cm$^2$, which reduces the occurrence of distortion in the third process.

Another process of consolidation which is effective is to place the material powder or the compact made from the material powder in a die and forge it at a pressure lower than 4 t/cm$^2$ while it is heated electrically. When electrical current is run through the powder or compact, it is heated by Joule heat. Generation of heat is larger at grain boundary areas of the powder material and interfacing areas of Al and Si where there is more electrical resistance. Therefore, plastic flow rate of the powder or compact increases and consolidation under low pressure is possible. Consolidation can be carried out effectively if pulse waves are used or used as supplement for electrical heating. Although this process can be carried out in the air, densification will be promoted if it is done in vacuum of 1 Torr or lower since plasma will be generated on the grain surface and the oxide layer on the surface will be disrupted.

The above process does not require high pressure for consolidation and is also economically advantageous. The Al—Si alloy produced by the above process has a half value width of the peak of Si (531) between 110° and 120° by X-ray diffraction (Cu-K$\alpha$1 ray: wavelength 1.5405 Å) of 0.60 or smaller. This provides a semiconductor material having a thermal conductivity of 0.30 cal/cm.sec.° C. or higher.

Dispersion of lattice vibration in Al can also be suppressed by following a similar procedure although the effect is not as evident as in Si. When the thermal conductivity is 0.30 cal/cm-sec.° C. or higher, the half value width of the peak of Al (420) between 110° and 120° by X-ray diffraction is 0.5° or smaller.

It is necessary to reduce distortion in the lattice by further heat treatment if the half value width of Si (531) peak between 110° and 120° by X-ray (Cu-K$\alpha$1 ray: wavelength 1.5405 Å) diffraction is over 0.6° in any of the consolidated bodies produced by the first, second and also third processes. The heat treatment should be carried out at 400° C. or higher for at least one hour. A temperature lower than 400° C. is not sufficient for providing the effect of reducing distortion. The treatment time of shorter than one hour can provide only insufficient level of reduction in distortion. With these respects, it is desirable to conduct the treatment for at least one hour at 400° C. or higher. Such heat treatment permits the thermal conductivity of 0.30 cal/cm-sec.° C. or higher.

The substrate material with an Al covering layer made of Al or Al alloy of the present invention is explained below. This semiconductor substrate material is made of Al—Si alloy with a 50–80% Si content by weight and is provided with an Al covering layer of 5–500 μm in thickness made of Al or Al alloy on at least one surface (side) and has an insulating or plating layer on the outermost surface of the Al covering layer. As explained already at the end of the section on the first process, the insulating or plating layer can be applied to the Al—Si alloy substrate directly without forming the covering layer of Al or Al alloy. However since the substrate material contains a lot of Si, it is desirable to apply the insulating or plating layer over the Al covering layer for better adherence and also the covering layer is effective in covering pinholes on the substrate material.

The Al covering layer of Al or Al alloy of the present invention is disposed and attached according to the following processes.

(1) In the above mentioned first and second processes, when compression molding the Al—Si alloy powder with a 50–80% Si content, a precursor layer of such substance as Al or Al alloy foil or Al or Al alloy powder, which turns into the aluminum covering layer of Al or Al alloy in the subsequent consolidation, is disposed on the mixed powders or Al—Si alloy powder charged in a mold cavity so as to cover at least one surface of a compact to be formed and adhered to the Al—Si alloy compact during this molding. The precursor layer may be placed onto at least one surface of a compact after forming the compact. The thus obtained compacts are consolidated. Other than Al or Al alloy foil or powder, any substance that turns into Al or Al alloy at the time of consolidation at about 400° C. such as organic or inorganic aluminum salt powder or pellets that can be decomposed at low temperature may be considered to be used as the precursor layer. The substances may be dispersed into solvent and a certain amount of it may be applied.

(2) In the first and second processes, after the Al—Si alloy powder is consolidated, a solution including Al or Al alloy as its main component can be applied to the consolidated body by such processes as dipping, spray coating, screen printing or vapor depositing.

With the processes other than the process of adhering Al or Al alloy foil mentioned above, it is necessary to choose a precursory substance from which the components other than Al and Al alloy can be removed by debinding or heat treatment before the compact is consolidated, especially in cases where the Al covering layer is formed in the process of molding. When the aluminum covering layer is formed after the consolidation, an additional step is required for adhesion with, for example, heat after the placement of the covering layer.

With the process mentioned in (1) above, the Al foil or the Al covering layer formed therefrom does not have to be a single component substance. For example, elements such as Mg, Si and Cu may be contained in the alloy for improved performance if surface treatment such as alumite treatment or plating is feasible. Therefore, if Al—Si alloy is used as the Al foil or Al covering layer, its Si content should be less than 50% by weight.

With the process of adhering the Al or Al alloy foil in the process of molding, the thickness of the Al or Al alloy foil should be so that the thickness of the Al covering layer formed later by forging will be 5–500 μm. However, if there isn't much change in size sideways during the forging process, the thickness of the Al covering layer formed will be about the same as that of the Al or Al alloy foil.

The compact whose surface is coated with a precursory layer of such as Al foil is to be consolidated by forging. Here, it is desirable that the compact be heated to 400° C. or higher and forged with a forging die at a die temperature of 150° C. or higher and a forging pressure of 4 t/cm² or higher. It is even more desirable if the compact is heated to 550° C. or higher and forged with a forging die at a die temperature of 300° C. or higher and a forging pressure of lower than 4 t/cm² as stated previously. The densification of the forged compact can not be achieved unless either one of these forging conditions are satisfied.

The forged body obtained by the above process has an Al covering layer on its surface. Since this Al covering layer has gone through the forging process, it is integrated with the underlying Al—Si alloy and adhered solidly. A layer of surface treatment with strong adherence and no pinholes may be formed over this Al covering layer. If the surface treatment layer is an alumite layer, the resulting body can be used as a semiconductor substrate material with superb corrosion resistance and insulating property. And if the surface treatment layer is a plating layer, it can be used as a semiconductor substrate material with superb corrosion resistance and brazing ability. The same can be said in the formation of other Al or Al alloy covering layers.

It is desirable that the thickness of the Al covering layer be in the range of 5–500 μm. This is because if the thickness of the Al covering layer is smaller than 5 μm, it may be corroded during the Alumite treatment process for forming an insulating layer or the plating treatment process for forming a plating layer on the covering layer, or the silicon in the underlying Al—Si alloy may diffuse over the surface since it is too thin. As a result, adherence of the surface treatment layer is weakened and the corrosion resistance, insulating property and brazability are lowered. And if the thickness of the Al covering layer is larger than 500 μm, the coefficient of thermal expansion of the substrate material may increase or the substrate material may warp since it is too thick and hence not desirable.

The substrate material with an Al covering layer as mentioned above can be made into a semiconductor substrate material with superb corrosion resistance and insulating properties by forming an alumite layer on the outermost surface of the Al covering layer with alumite treatment as mentioned above. Corrosion resistance and brazability can also be added to the semiconductor substrate material by forming a plating layer on the outermost surface of the Al covering layer with a plating treatment. Since these surface treatment layers are formed over an even Al covering layer, their adherence is strong and a superb alumite layer with no pinholes can be obtained. In other words, due to the presence of such an Al or Al alloy covering layer, it is quite easy to form those surface treatment layers compared to the previously mentioned process of forming those surface treatment layers directly on the Al—Si alloy substrate with a high Si content of 50–80% by weight, without the Al or Al alloy covering layer.

As for processes of forming an insulating layer, the outermost surface of the covering layer can be transformed into alumite by anodic oxidation. Also, a solution containing an insulating substance such as ceramic dispersed therein is applied onto the covering layer through dipping or by spray coating. Paste mainly containing an insulating substance as a main component can be screen printed or applied with a brush. An insulating layer can also be formed by vapor deposition in normal vapor phase. Furthermore, chemical reactions in vapor phase under a normal temperature or heated condition can be used. For example, a densified layer of AlN is formed by nitriding, for example, in a gas stream containing nitrogen. This is one of the desirable examples since an AlN layer has an excellent thermal conductivity and its adherence and insulating property are also good. Many other processes may be considered.

The difference in coefficient of thermal expansion between the surface treatment layer and the Al or Al alloy layer, or the Al—Si alloy substrate material has to be taken into consideration in processes other than the anodic oxidation process and the vapor phase chemical reaction process mentioned above. However it is quite flexible since the Al or Al alloy covering layer itself can act as a thermal stress buffer layer. But needless to say the substance added for coating or vapor deposition and the process of adherence must be selected carefully in order to secure solid adherence and according to the specific performance required in practical use.

EXAMPLE 1

Al—Si alloy materials for a semiconductor substrate were produced according to the process in FIG. 1. Molten Al—Si alloys with 10, 30, 40, and 50% Si contents by weight were rapidly solidified using the air atomizing process at a solidification rate of $10^3$° C./sec to form rapidly solidified Al—Si alloy powders. Each rapidly solidified Al—Si powder thus obtained was sieved to secure grain size of 40 $\mu$m or smaller. Production of a powder with at least 50% Si content was also attempted but it reacted with a crucible made of carbon and the resulting powder was found to contain SiC as an impurity.

An Si powder having a maximum grain size of 40 $\mu$m and an average grain size of 10 $\mu$m was added to and mixed with each rapidly solidified Al—Si alloy powder in accordance with the ratio shown in Table 1 to obtain each Al—Si mixed powder. Mixing was done by putting alumina balls of 1 cm in diameter in an amount of 10 times the weight of the mixed powders in a pot and rotating it for one hour. The amount of Si content in the mixed powders is the same as that in the final Al—Si alloy to be produced.

TABLE 1

| Sample | Si content (wt %) in rapidly solidified powder | Amount of Si powder added (wt %) | Si content (wt %) in mixed powder |
|---|---|---|---|
| 1 | 10 | 50 | 55 |
| 2 | 30 | 20 | 44 |
| 3 | 30 | 40 | 58 |
| 4 | 30 | 50 | 65 |
| 5 | 40 | 10 | 46 |
| 6 | 40 | 20 | 52 |
| 7 | 40 | 30 | 58 |
| 8 | 40 | 40 | 64 |
| 9 | 40 | 50 | 70 |
| 10 | 50 | 10 | 55 |
| 11 | 50 | 20 | 60 |
| 12 | 50 | 30 | 65 |
| 13 | 50 | 40 | 70 |
| 14 | 50 | 50 | 75 |
| 15 | 50 | 60 | 80 |

The resultant mixed powders were formed into a tablet of 20 mm (diameter) by 30 mm (height) under a 4 t/cm² pressure. The true density ratio of each compact was 72–78%. Molding of mixed powders, which were prepared by adding the Si powder to the rapidly solidified Al—Si alloy powder in such an amount that the added Si powder would be more than 60% in the mixed powders, was also attempted but chipping occurred in the compact.

Next, each compact was heated to 540° C. and consolidated by forging in a forging die heated at 300° C. under a bearing pressure of 6 t/cm². The density, thermal conductivity and coefficient of thermal expansion of each forged body were measured and are listed in Table 2. The density was measured using the Archimedean process and thermal conductivity was measured using the laser flash process. The coefficient of thermal expansion was obtained by averaging the values, obtained by the push rod process, between 20°–200° C.

TABLE 2

| Sample | Density (g/cm³) | Thermal conductivity (cal/cm · sec · °C.) | Coefficient of thermal expansion ($\times 10^{-6}$/°C.) | Si content (wt %) |
|---|---|---|---|---|
| 1 | 2.49 | 0.33 | 10.6 | 55 |
| 2 | 2.53 | 0.35 | 12.3 | 44 |
| 3 | 2.49 | 0.32 | 10.2 | 58 |
| 4 | 2.44 | 0.30 | 9.3 | 65 |
| 5 | 2.52 | 0.34 | 11.7 | 46 |
| 6 | 2.50 | 0.31 | 10.9 | 52 |
| 7 | 2.48 | 0.30 | 10.0 | 58 |
| 8 | 2.45 | 0.29 | 9.4 | 64 |
| 9 | 2.44 | 0.29 | 8.6 | 70 |
| 10 | 2.49 | 0.30 | 10.4 | 55 |
| 11 | 2.48 | 0.30 | 9.7 | 60 |
| 12 | 2.45 | 0.25 | 9.3 | 65 |
| 13 | 2.43 | 0.28 | 8.5 | 70 |
| 14 | 2.41 | 0.28 | 7.6 | 75 |
| 15 | 2.40 | 0.28 | 6.6 | 80 |

Figure 3:
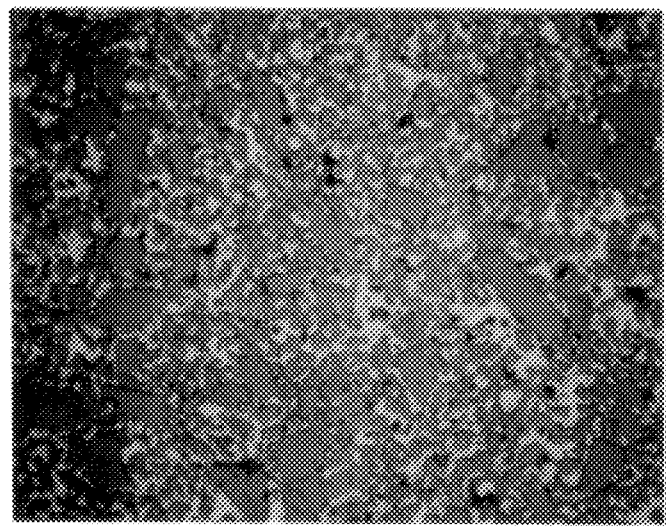
FIG. 3 is a microscope photograph (×400) of the metal structure of a material for a semiconductor substrate of Sample 7 obtained in Example 1.

The above results clearly show that the density of 2.5 g/cm³ or lower, the coefficient of thermal expansion of $12\times10^{-6}$/° C. or smaller, and the thermal conductivity of 0.28 cal/cm.sec.° C. or higher are possible by regulating the Si content in the Al—Si alloy to 50–80% by weight. An optical microscope photograph (×400) showing the structure of sample 7 is shown in FIG. 3. The white parts are aluminum (Al) and the gray parts are silicon (Si).

Comparative Example 1

Molten Al—Si alloys with 50, 60, 70 and 80% Si contents were rapidly solidified using the air atomizing process at a solidification rate of $10^3$° C./sec to produce rapidly solidified Al—Si alloy powders. A crucible made of BN which has a high thermal resistance and does not react with the molten Al—Si alloy was used and titanium alloy was used for the nozzle or other parts where there was direct contact with the molten alloy.

Each rapidly solidified Al—Si alloy powder obtained was sieved to secure a grain size of 40 $\mu$m or smaller and molded directly into a tablet shape of 20 mm (diameter)×30 mm (height) at a pressure of 4 t/cm². The true density ratio of each compact was 72–78%. After each compact was heated to 540° C., it was consolidated by forging it in a forging die heated at 300° C. under a bearing pressure of 6 t/cm². Density, thermal conductivity and coefficient of thermal expansion of each forged body were measured by the same processes as used in Example 1 and are listed in Table 3.

TABLE 3

| Sample | Si content (wt %) | Density (g/cm³) | Thermal conductivity (cal/cm · sec · °C.) | Coefficient of thermal expansion (×10⁻⁶/°C.) |
|---|---|---|---|---|
| 16 | 50 | 2.50 | 0.27 | 11.2 |
| 17 | 60 | 2.43 | 0.25 | 9.8 |
| 18 | 70 | 2.40 | 0.23 | 8.7 |
| 19 | 80 | 2.38 | 0.20 | 6.5 |

Figure 4:
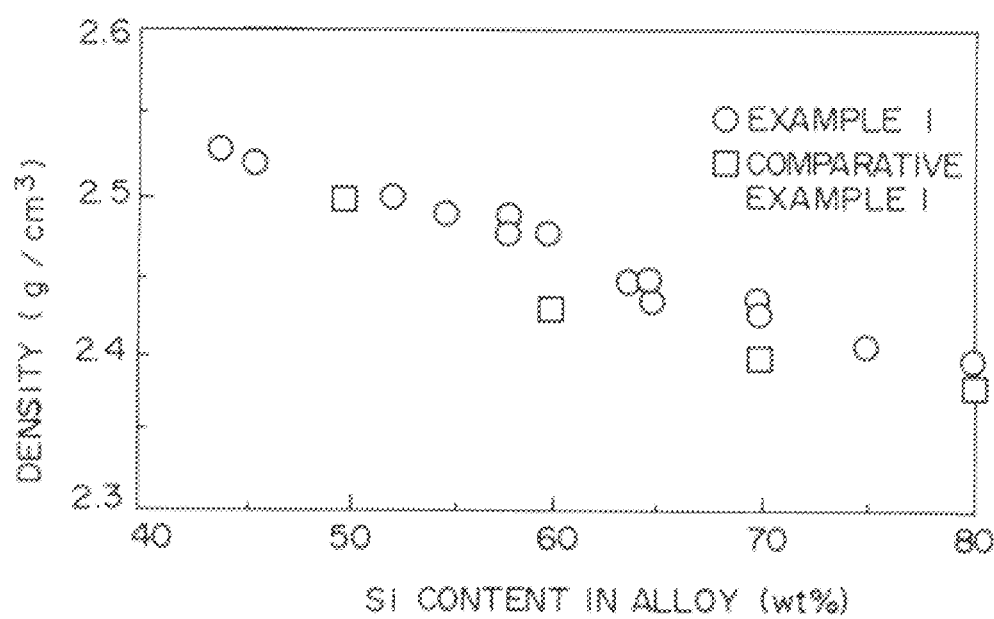
FIG. 4 is a graph showing a relationship between density and silicon content for forged bodies obtained in Example 1 and Comparative Example 1.
Figure 5:
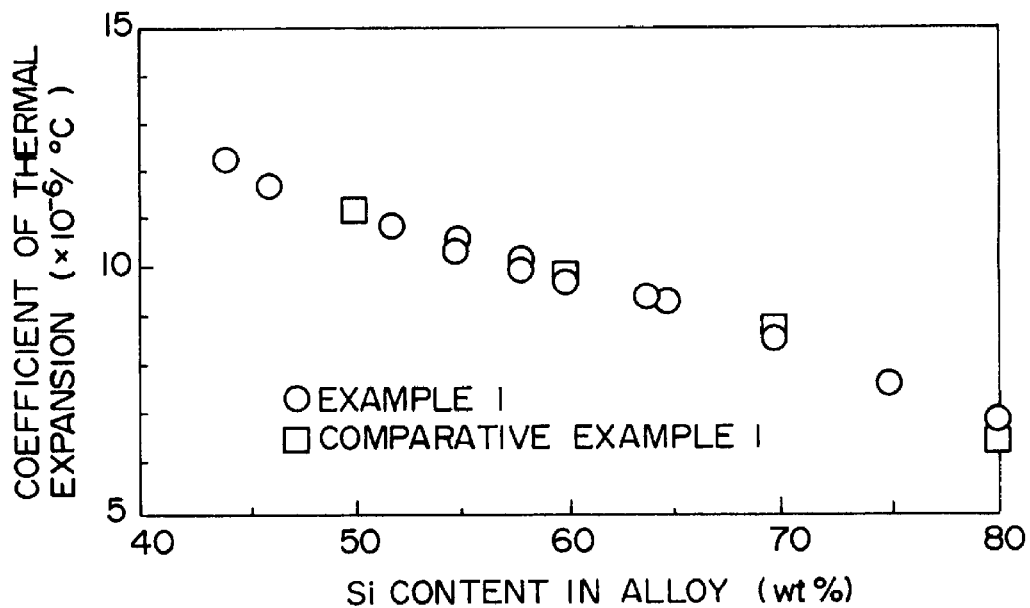
FIG. 5 is a graph showing a relationship between coefficient of thermal expansion and silicon content for forged bodies obtained in Example 1 and Comparative Example 1.
Figure 6:
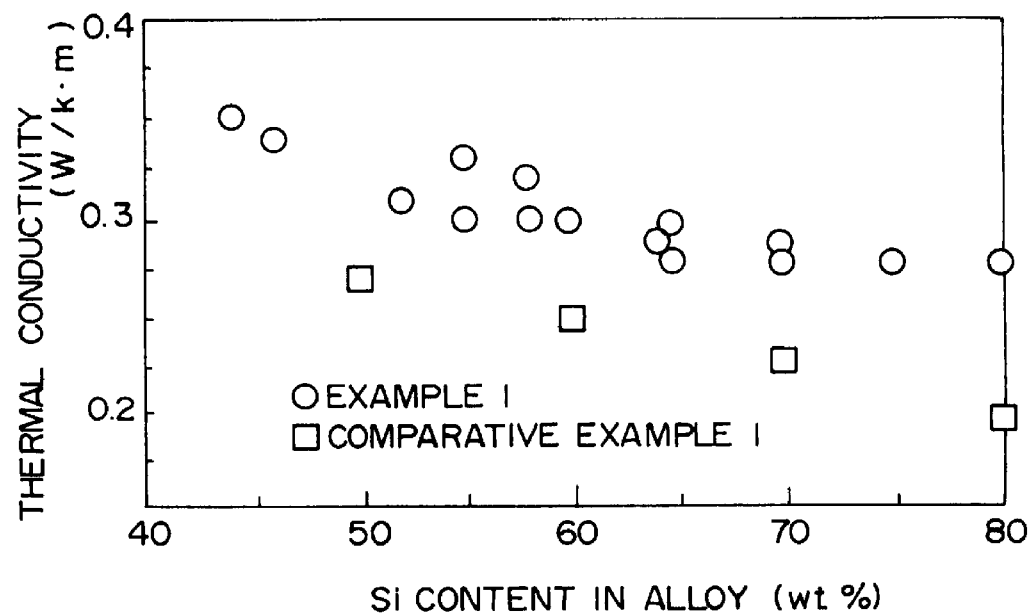
FIG. 6 is a graph showing a relationship between thermal conductivity and silicon content for forged bodies obtained in Example 1 and Comparative Example 1.

These values of the density, the coefficient of thermal expansion and the thermal conductivity of each forged body in this Comparative Example 1 were plotted in FIGS. 4 to 6 along with those in Example 1 and the two examples were compared. FIG. 5 shows that there is not much difference in coefficient of thermal expansion depending on the process. However, FIG. 4 shows that the density of each forged body in Example 1 is higher than that in Comparative Example 1. Furthermore, FIG. 6 shows that the thermal conductivity of each forged body in Example 1 is also higher than that in Comparative Example 1.

From these results, it is thought that each Al—Si alloy of the present invention produced by the process in Example 1 has less heat dispersion rate since there are fewer pores than those produced by the conventional processes and hence has the improved thermal conductivity. Furthermore, in the process of the present invention, the amount of impurities was small and the amount of silicon solid solution in aluminum was also small. These are also thought to be contributing to the improved thermal conductivity.

EXAMPLE 2

A molten Al—Si alloy with a 40% Si content was rapidly solidified using the air atomizing process at a solidification rate of $10^{3°}$ C./sec to produce a rapidly solidified Al—Si alloy powder. The rapidly solidified Al—Si alloy powder was sieved to secure a grain size of 40 μm or smaller. The Si powder used in Example 1 was added to this rapidly solidified Al—Si alloy powder and mixed as in Example 1 so that the resulting mixed powder would have an Si content of 58% by weight.

The mixed powders were then molded into a tablet shape of 20 mm (diameter) by 30 mm (height) at a pressure of 7 t/cm². The true density ratio of the compact about was 85%. The compact was then sintered under an atmospheric pressure with a nitrogen partial pressure of 0.99 atm or higher at 540° C. for 2 hours. The sintered body obtained was further subjected to sizing treatment at a bearing pressure of 8 t/cm². This sintered body had a density of 2.45 g/cm³, a coefficient of thermal expansion of $9.8 \times 10^{-6}/°$ C. and a thermal conductivity of 0.30 cal/cm.sec.° C.

EXAMPLE 3

An Al—Si alloy was made in the same way as described in Example 1 and substrates made of the alloy were used to produce IC packages as shown in FIGS. 7 through 12.

More specifically, a molten Al—Si alloy with a 40% Si content was rapidly solidified by air atomizing at a solidification rate of $10^{3°}$ C./sec to produce a rapidly solidified Al—Si alloy powder. The alloy powder was sieved to secure a grain size of 40 μm or smaller. Si powder was added to the rapidly solidified Al—Si alloy powder so that the amount added would be 40% of the amount of the resulting mixed powders. Mixing was done by putting the mixed powders and alumina balls of 1 cm in diameter in an amount of 10 times the amount of the mixed powders into a pot and rotating it for 1 hour.

The mixed powders were compression molded at a pressure of 2.5 t/cm² into a tablet shape of 98 mm (diameter)×50 mm (height) whose true density ratio was about 74%. After each compact was heated to 540° C., it was consolidated by forging in a forging die of 100 mm in diameter preheated to 300° C., at a bearing pressure of 6 t/cm². The resulting forged body of Al—Si alloy had a density of 2.45 g/cm³, a coefficient of thermal expansion of $9.4 \times 10^{-6}/°$ C. and thermal conductivity of 0.29 cal/cm.sec.° C.

Figure 7:
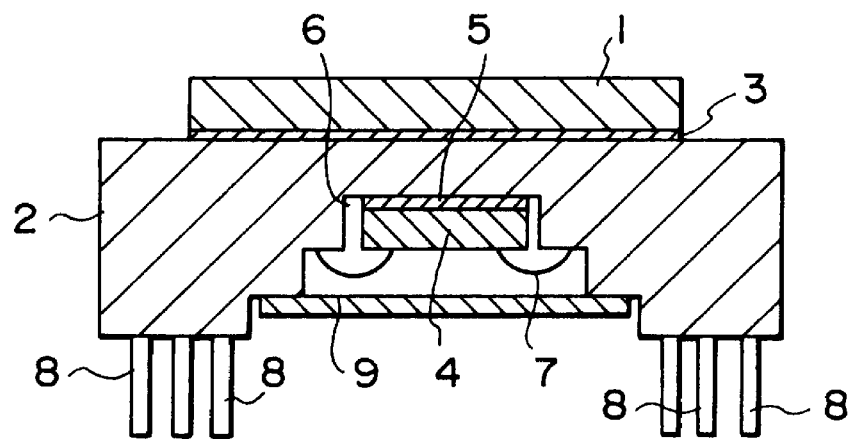
FIG. 7 is a schematic cross-sectional view showing a specific embodiment of an IC package having a substrate therein which is formed of the material for a semiconductor substrate according to the present invention.

In the preparation of a substrate 1 of an IC package in FIG. 7, the above forged Al—Si alloy body was cut into a plate of specified dimensions and surface treated by the common process of anodic oxidation. This substrate 1 is bonded to a main body 2 of the package (hereinafter "main package body") with a high thermal conductivity resin 3 such as epoxy resin including metal fillers therein. The substrate 1 may be bonded to the main package body 2 with solder after it is cut and subjected to a specific plating treatment.

This main package body 2 is equipped with a die attaching section 6 in the center where a semiconductor chip 4 is mounted and bonded with a bonding material 5 such as solder or resin. One end of a bonding wire 7 is connected to the pad of the semiconductor chip 4 for electrical connections between the semiconductor chip 4 mounted in the die attaching section 6 and an external circuit. The other end of the bonding wire 7 is connected to the wiring formed on the main package body 2. The semiconductor chip 4 is connected through this wiring to metal lead pins 8 attached to the main package body 2 for connections to the external circuits. After the semiconductor chip 4 is mounted, a cover 9 is attached to the main package body 2.

Figure 8:
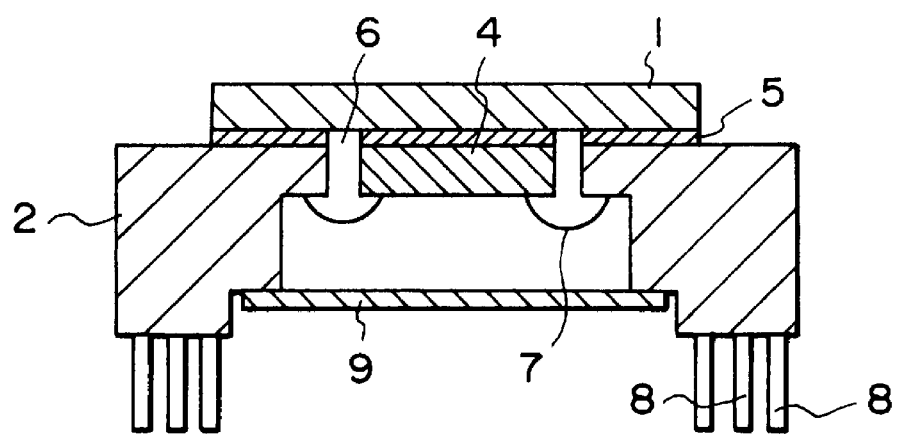
FIG. 8 is a schematic cross-sectional view showing another specific embodiment of an IC package having a substrate therein which is formed of the material for a semiconductor substrate according to the present invention.

The IC package in FIG. 8 is different from the one in FIG. 7 in that the semiconductor chip 4 is mounted directly to the substrate 1 with a bonding material 5 such as solder or resin. The forged body of Al—Si alloy is cut into specified plate dimensions and its surface is plated with Ni/Au using a common process to be used as the substrate 1. The main package body 2 has, as a die attaching section 6, an opening on its base, and the substrate 1 is bonded with a bonding material 5 such as Au-Si solder in the manner of covering the opening. The semiconductor chip 4 is mounted directly onto this substrate 1 as mentioned previously.

With an IC package having a structure in which a semiconductor chip 4 is mounted directly onto a substrate 1 as in this case, the shape of the side of the substrate 1 on which the semiconductor chip 4 is mounted is not particularly restricted. For example, as in FIG. 9, it can be in a convex shape with two levels. Other structures in FIG. 9 are the same as in FIGS. 7 and 8.

Figure 9:
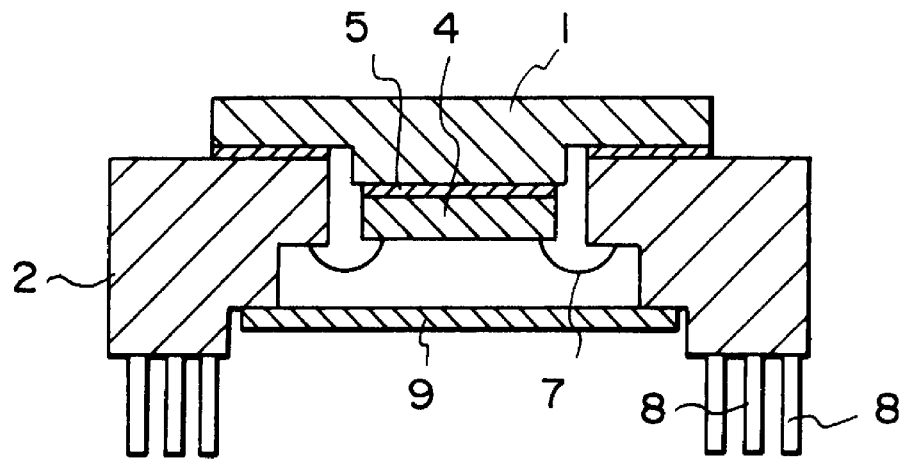
FIG. 9 is a schematic cross-sectional view showing yet another specific embodiment of an IC package having a substrate therein which is formed of the material for a semiconductor substrate according to the present invention.

The material of the main package body 2 in FIGS. 7 to 9 is not particularly restricted. For example, it can be made of ceramic, such as an alumina-ceramic multilayer substrate with an alumina content of about 90%, which is used widely at present, or a low temperature firable glass-ceramic multilayer substrate firable at about 1000° C. and containing glass-ceramic which enables high speed processing of signals; or made of plastic, such as a plastic multilayer substrate made of epoxy resin, polyimide resin or the like, which is inexpensive and suited for general use.

Figure 10:
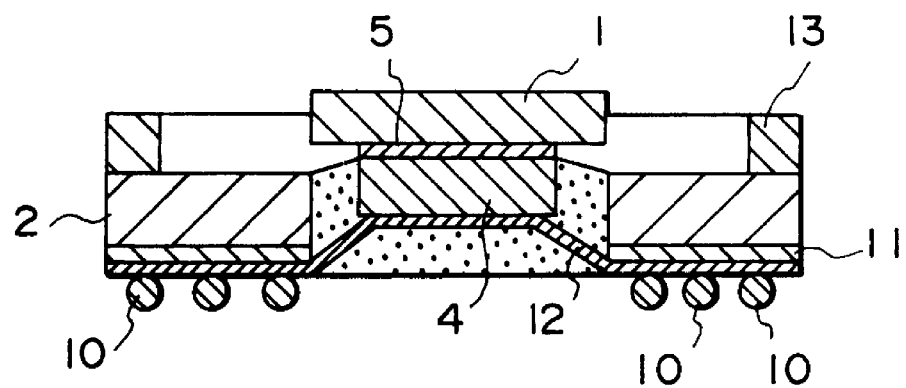
FIG. 10 is a schematic cross-sectional view showing a specific embodiment of an IC package with solder balls, having a substrate therein which is formed of the material for a semiconductor substrate according to the present invention.
Figure 11:
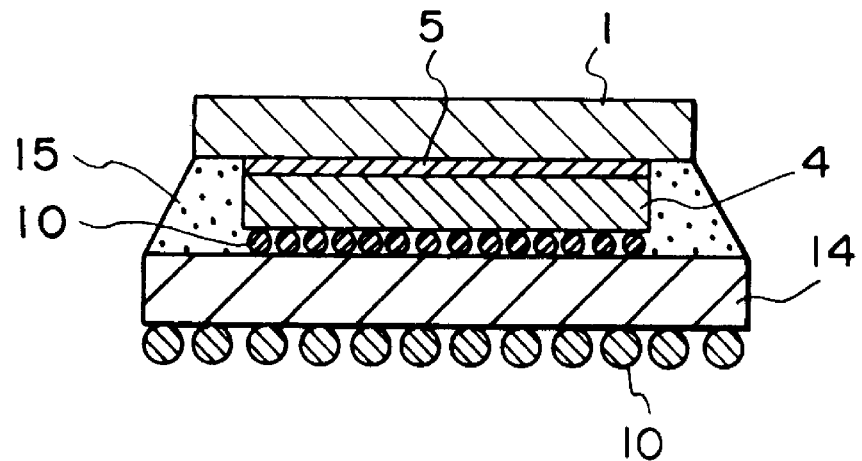
FIG. 11 is a schematic cross-sectional view showing another specific embodiment of an IC package with solder balls, having a substrate therein which is formed of the material for a semiconductor substrate according to the present invention.

In a further alternative structure, instead of the metal lead pins 8 attached to the main package body 2 for connections to external circuits, solder balls 10 may be attached to the main package body 2, as shown in FIGS. 10 and 11. The forged body of Al—Si alloy is cut into specified plate dimensions and its surface is plated with Ni using a common process to be used as a substrate 1 in these IC packages. The semiconductor chip 4 is bonded to this substrate 1 with a bonding material 5 such as adhesive resin.

With the package in FIG. 10, the main package body 2 has a polyimide tape 11 equipped with a Cu foil circuit wiring 12. The semiconductor chip 4 is bonded and mounted by TAB (tape automated bonding) onto the center of the main package body 2 and a support ring 13 is bonded to reinforce the main package body 2. On the other hand, with the package in FIG. 11, the semiconductor chip 4 bonded to a substrate 1 is flip chip mounted, via solder balls 10 formed on its pad, to a wiring substrate 14 equipped with solder balls 10 for connections to external circuits and its flank is packed with resin 15 to protect the semiconductor chip 4. The process of mounting the semiconductor chip 4 to a package in FIGS. 10 and 11 is not limited to the above mentioned processes and the substrate 1 is not limited to a plate shape but can be in such shape as a cap.

Figure 12:
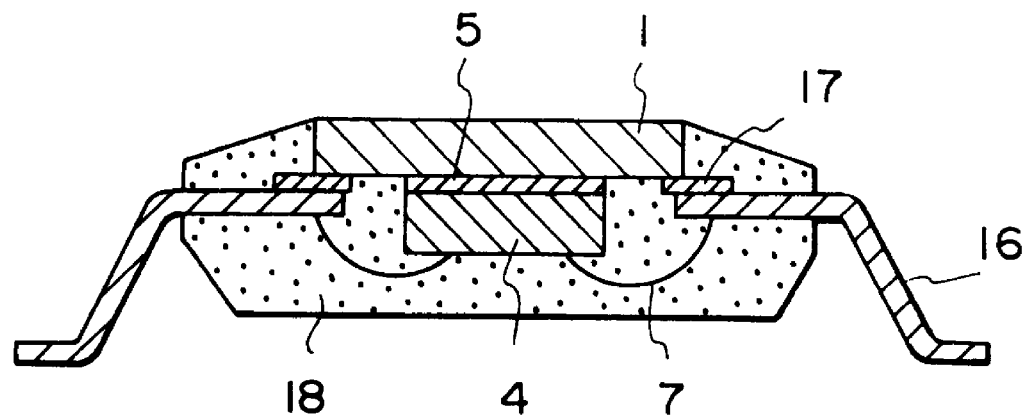
FIG. 12 is a schematic cross-sectional view showing a specific embodiment of a molded IC package having a substrate therein which is formed of the material for a semiconductor substrate according to the present invention.
Figure 13:
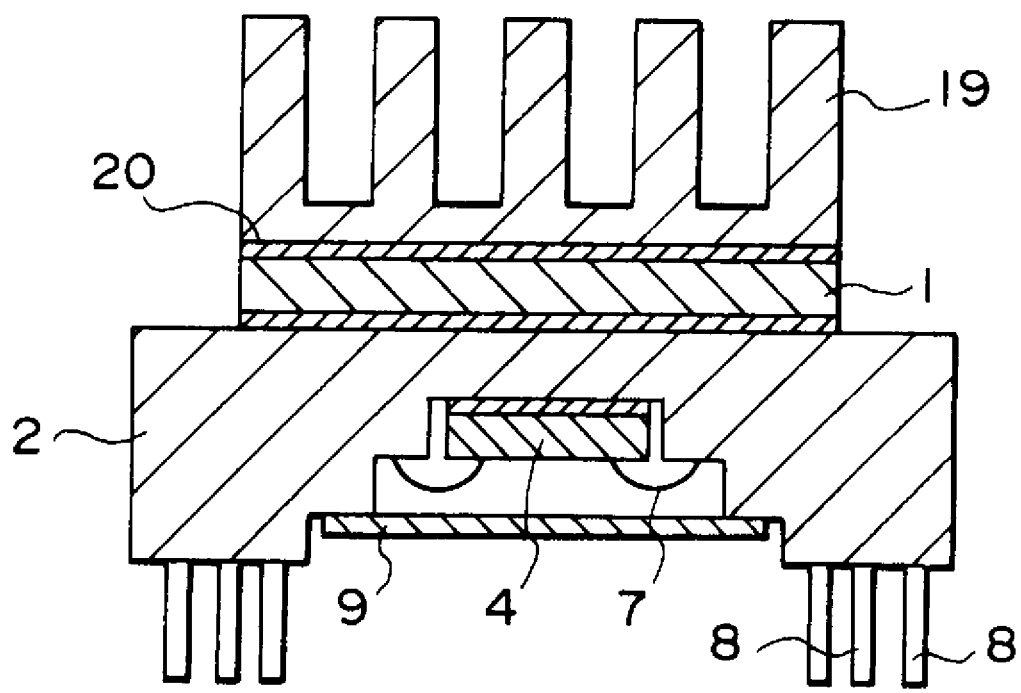
FIG. 13 is a schematic cross-sectional view showing a specific embodiment of an IC package with a radiation board, having a substrate therein which is formed of the material for a semiconductor substrate according to the present invention.

The IC package in FIG. 12 is of a resin mold type. The forged body of Al—Si alloy was cut into specified plate dimensions and its surface was plated with Ni/Au by a common process to be used as the substrate 1 which is bonded to a lead frame 16 via an insulating film 17. The semiconductor chip 4 is bonded to this substrate 1 with a bonding material 5 such as Ag paste and the lead frame 16 and the pad of the semiconductor chip 4 is connected by the bonding wires 7. The semiconductor chip 4 is molded together with the bonding wires 7 with a molding resin 18 by the transfer mold process.

With the IC packages shown in FIGS. 7–12, an Al fin with its surface treated by anodic oxidation may be bonded to the above mentioned substrate 1 made of Al—Si alloy in order to improve heat releasing capability. A package type shown in FIG. 7 is used here as an example for explanation. An Al fin 19 is bonded to the substrate 1 with a silicone resin 20 or the like. If a lightweight substrate of Al—Si alloy is used, a fin shaped substrate may be used without the resin bonding section which reduces the heat releasing capability. IC packages shown in FIGS. 7–13 are also applicable to multi chip moulde (MCM) type packages where a number of semiconductor chips are mounted.

Since the differential in thermal expansion between the substrate material made of Al—Si alloy of the present invention used as the substrate 1 in FIGS. 7–13 and silicon used in the semiconductor chip or materials generally used for a main package body was small, thermal distortion due to thermal stress was unlikely to occur during the production process of packages or IC mounting process. Furthermore, the substrate materials of the present invention provides IC packages with long life and superb reliability since they have high thermal conductivity and heat releasing capability. It is also assumed that they are effective for the stability of the solder shaping after solder reflowing especially in those packages with solder balls for connections to external circuits, since they are lightweight.

A semiconductor chip was mounted to each IC package shown in FIGS. 7–13 and a temperature cycling test (from −60° C. to +150° C., 100 cycles) was carried out. It was confirmed that thermal distortion due to thermal stress is unlikely to occur, since there was no abnormal action detected from the test.

EXAMPLE 4

A material for a semiconductor substrate was produced according to the production procedures in FIG. 2. First, a molten Al—Si alloy with a 70% Si content by weight was rapidly solidified using the water atomizing process at a solidification rate of $10^{4°}$ C./sec. and then dried by a warm current of air at a temperature of 50° C. for 4 hours to produce a rapidly solidified Al—Si alloy powder. Also, as a sample for comparison, the gas (air) atomizing process at a solidification rate of $10^{3°}$ C./sec was also used to produce a rapidly solidified Al—Si alloy powder. The maximum grain size of the Si crystals and the amounts of oxygen and impurities in each rapidly solidified Al—Si alloy powder were measured and listed for each spraying process in Table 4 below.

Then, each of the above mentioned rapidly solidified Al—Si alloy powders was sieved to secure grain size of 40 μm or smaller. The sieved rapidly solidified Al—Si alloy powder was molded into a tablet shaped test piece of 20 mm (diameter)×30 mm (height) at a molding pressure of 4 t/cm². The true density ratio of each compact obtained was 74–76%.

Next, each compact was heated to 540° C. and consolidated by forging using a forging die heated to 300° C. at a bearing pressure of 6 t/cm². The density, the thermal conductivity and the coefficient of thermal expansion of each forged body obtained were measured and added to Table 4 below. The density was measured by the Archimedean process and the thermal conductivity was measured by the laser flash process. The coefficient of thermal expansion was obtained by averaging the values, obtained by the push rod process, between 20°–200° C.

TABLE 4

| Sample | Atomizing method | Maximum grain size (μm) | Amount of oxygen (wt %) | Amount of impurities (wt %) |
| --- | --- | --- | --- | --- |
| 20 | Water | 10 | 0.4 | 0.4 |
| 21* | Gas | 35 | 1.2 | 1.1 |

| Sample | Atomizing method | Density (g/cm³) | Thermal conductivity (cal/cm · sec · °C.) | Coefficient of thermal expansion (×10⁻⁶/°C.) |
| --- | --- | --- | --- | --- |
| 20 | Water | 2.44 | 0.29 | 8.6 |
| 21* | Gas | 2.40 | 0.23 | 8.7 |

Note: A Sample with * is Comparative Example.

As it is clear from the above results, it is possible to make the grain size of silicon in the rapidly solidified Al—Si alloy powder small and reduce the amounts of oxygen and impurities in it by this process of the present invention, and, as a result, it was possible to achieve the thermal conductivity of 0.28 cal/cm.sec.° C. or higher in the forged body made of the inventive Al—Si alloy. This Al—Si alloy forged body also has the properties of density 2.5 g/cm³ or lower and coefficient of thermal expansion 12×10⁻⁶/° C. or smaller.

Figure 14:
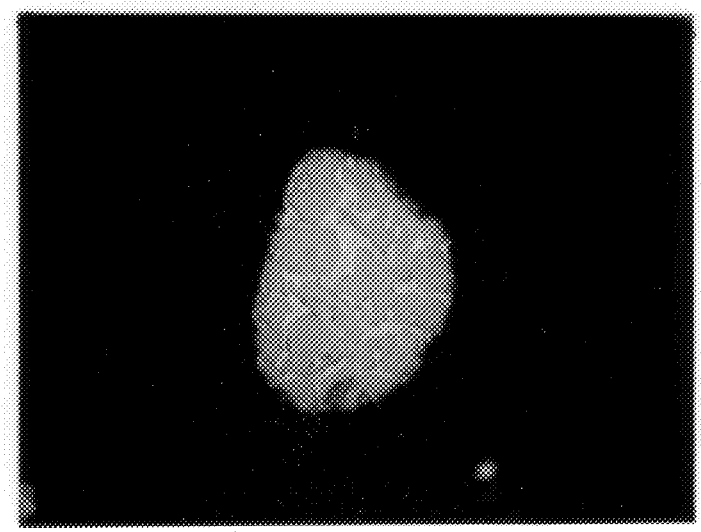
FIG. 14 is a microscope photograph (×1000) showing the metal structure at a cross-section of an aluminum-silicon alloy powder containing 70% by weight of silicon produced in Example 4.
Figure 15:
FIG. 15 is a microscope photograph (×400) showing the metal structure of a aluminum-silicon alloy forged body containing 70% by weight of silicon produced in Example 4.

A photograph (×1000) of a cross-section of the Al—Si alloy powder of sample 20 obtained in this example revealing its metal structure is shown in FIG. 14. The light parts are Al and the darker gray parts are Si. It shows that Si crystals having a grain size of 10 μm or smaller disperse in Al. A photograph (×400) of the metal structure of the forged Al—Si alloy body of sample 20 made of this alloy powder is shown in FIG. 15. It shows that the structure is fine and uniform with an average silicon grain size of 5 μm or smaller and even at maximum 20 μm or smaller.

EXAMPLE 5

Molten aluminum-silicon alloys containing 45%, 50%, 60%, 70%, 80% and 85% by weight of silicon were rapidly solidified by water atomization at a solidification rate of 10⁴° C./sec and each rapidly solidified aluminum-silicon alloy powder obtained was sieved to secure a grain size of 40 μm or smaller.

Next, each rapidly solidified aluminum-silicon alloy powder was molded into a tablet-shaped test piece of 20 mm in diameter and 30 mm in height under a molding pressure of 4 t/cm² and a compact having a true density ratio of 72% to 78% was obtained. After the compact was heated to 540° C., it was consolidated by forging in a forging die heated to 300° C. under a bearing pressure of 6 t/cm². The density, the thermal conductivity and the coefficient of thermal expansion of each forged body obtained were measured by the same process as in Example 4 and the values are listed in Table 5 below.

TABLE 5

| Sample | Si content (wt %) | Density (g/cm³) | Thermal conductivity (cal/cm · sec · °C.) | Coefficient of thermal expansion (×10⁻⁶/°C.) |
|---|---|---|---|---|
| 22* | 45 | 2.53 | 0.35 | 12.4 |
| 23 | 50 | 2.50 | 0.32 | 11.3 |
| 24 | 60 | 2.47 | 0.30 | 9.8 |
| 25 | 70 | 2.44 | 0.29 | 8.6 |
| 26 | 80 | 2.40 | 0.28 | 7.0 |
| 27* | 85 | Cracks occurred in the compact and the testing thereafter was cancelled. | | |

Note: Samples with * are Comparative Examples

It is clear from the results in Table 5 that it is possible to achieve a density of 2.5 g/cm³ or lower and a coefficient of thermal expansion of 12×10⁻⁶/° C. or smaller as well as a thermal conductivity of 0.28 cal/cm.sec.° C. or higher by limiting the amount of silicon in an aluminum-silicon alloy between 50% and 80% by weight.

EXAMPLE 6

A molten aluminum-silicon alloy containing 60% by weight of silicon was rapidly solidified by water atomizing at a solidification rate of 10⁴° C./sec and the rapidly solidified aluminum-silicon alloy powder obtained was sieved to secure a grain size of 40 μm or smaller. This alloy powder was molded into a tablet-shaped test piece of 20 mm in diameter and 30 mm in height under a molding pressure of 7 t/cm² and a compact with a true density ratio of 85% was produced.

Next, this compact was sintered at 540° C. for 2 hours in a nitrogen atmosphere of nitrogen partial pressure of 0.99 atm or higher at an atmospheric pressure. This sintered body was further sized under a bearing pressure of 8 t/cm². The sintered body after sizing had a density of 2.43 g/cm³, a thermal conductivity of 0.28 cal/cm.sec.° C. and a coefficient of thermal expansion of $9.8 \times 10^{-5}$/° C.

EXAMPLE 7

A material for a semiconductor substrate made of the aluminum-silicon alloy of the present invention is used, for example, as a substrate for each IC package in FIGS. 7–13 which was explained in Example 3 above.

The aluminum-silicon alloy used in this example was a forged body (aluminum-70 wt. % silicon alloy) produced by the same process as sample 20 in Example 4 and the forged body had a density of 2.44 g/cm³, a coefficient of thermal expansion of 8.6×10⁻⁶/° C. and a thermal conductivity of 0.29 cal/cm.sec.° C. This forged body was cut into a desired shape and used as a substrate 1 for producing each IC package. The structure of each package is as explained in Example 4 and hence a further detailed description is omitted here.

The substrate 1 in FIGS. 7–13 comprises the aluminum-silicon alloy of the present invention in which distortion due to thermal stress is unlikely to occur during the IC mounting process since the difference in coefficient of thermal-expansion between the alloy and silicon, the main material of a semiconductor chip 4, or the main material of a main package body 2, is small as mentioned previously. Also, since the substrate 1 of the aluminum-silicon alloy has a high thermal conductivity and hence a high heat dissipation capability, an IC package using this substrate has a long life and a superb reliability.

A heat resistance test at 200° C. for 15 minutes and a heat cycle test of 100 cycles within a temperature range of from −60° C. to +150° C. were carried out on these IC packages. However, no abnormality in performance occurred and no change in appearance was confirmed.

EXAMPLE 8

Figure 16:
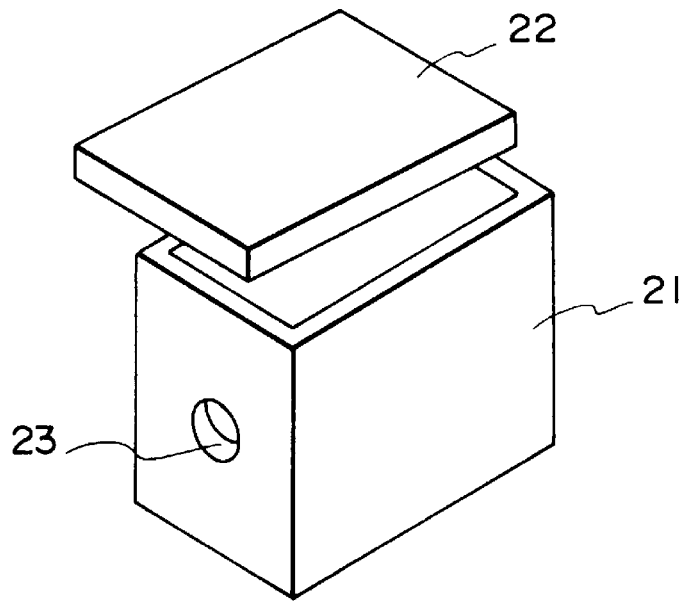
FIG. 16 is a schematic cross-sectional view showing a specific embodiment of a package for a microwave integrated circuit, having a substrate therein which is formed of the material for a semiconductor substrate according to the present invention.

A package comprising a case 21 and a lid 22 shown in FIG. 16 was produced using each of the forged bodies of sample 4 in Example 1 (aluminum-65 wt. % silicon alloy) and sample 20 in Example 4 (aluminum-70% silicon alloy). Each body was plated with nickel after it was cut. As mentioned previously, the forged body of sample 4 had a density of 2.44 g/cm³, a coefficient of thermal expansion of 9.3×10⁻⁶/° C. and a thermal conductivity of 0.30 cal/cm.sec.° C. and the forged body of sample 20 had a density of 2.44 g/cm³, a coefficient of thermal expansion of 8.6× 10⁻⁶/° C. and a thermal conductivity of 0.29 cal/cm.sec.° C. The case 21 had a hole 23 for a lead terminal and a microwave integrated circuit substrate is to be mounted inside the case 21.

By using the substrate material made of the aluminum-silicon alloy of the present invention as mentioned above, an increased reliability could be obtained since the difference in coefficient of thermal expansion between the alloy and silicon composing the microwave integrated circuit is small compared to a case in which, for example, an aluminum-silicon alloy containing 40% by weight of silicon is used. Therefore, even if the size of the substrate was doubled in the length of the edge, packages having a high reliability, particularly with regard to airtightness for bonding and heat releasing capability, could be obtained.

A heat resistance test at 200° C. for 15 minutes and a heat cycle test of 100 cycles within a temperature range of from −60° C. to +150° C. were carried out on this package for this microwave integrated circuit. However, even after the tests, an airtightness of approximately 1×10⁻¹⁰ cc/sec was maintained, the heat releasing capability was unchanged, no abnormality in the functions of the IC was confirmed and no change in appearance occurred.

EXAMPLE 9

An aluminum-silicon alloy powder containing 40% by weight of silicon was produced by the water atomizing process at a rapid solidification rate of $10^{3°}$ C./sec. Silicon powder was added to and mixed with the Al—Si alloy powder to make "powder A" containing 70% by weight of silicon in accordance to the procedure shown in FIG. 1. Also, a powder containing 70% by weight of silicon was produced by water atomizing at a rapid solidification rate of $10^{4°}$ C./sec which is to be called "powder B".

Each of powder A and B thus obtained was sieved to 40 μm or less and molded into a tablet shaped test piece of 20 mm in diameter and 30 mm in height under a pressure of 4 t/cm² to obtain a compact having a true density ratio of 74 to 76%. After each compact was heated to 540° C. or 565° C., it was consolidated by forging using a die heated at 500° C. under a bearing pressure of 3 or 10 t/cm². The density, the thermal conductivity, the coefficient of thermal expansion and the half value width of silicon (531) peak and aluminum (420) peak at 110° C. to 120° C. by X-ray (Cu-Kα1 ray: wavelength 1.5405 Å) diffraction of each forged body were measured in the same way as in Example 4 and the results are shown in Table 6.

EXAMPLE 10

Aluminum-silicon alloy powders A and B containing 70% by weight of silicon were produced in the same manner as in Example 9. Each powder was put in a die made of carbon, then heated to 540° C. by means of applying an electrical current under conditions of 5 V and 2000 A at a pressure of 1 or 3 t/cm² and was kept under these conditions for 3 minutes. It was also sintered in a vacuum atmosphere of 0.1 Torr or lower by means of applying a pulse current under the conditions of 5 V, 2000 A and 50 ms as a pressure of 1 t/cm².

The density, the thermal conductivity, the coefficient of thermal expansion and the half value width of the silicon (531) peak and the aluminum (420) peak at from 110° to 120° by X-ray (Cu-Kα1 ray: wavelength 1.5405 Å) diffraction of each sintered body were measured by the same processes as in Example 4 and the results are shown in Table 7.

TABLE 6

| Powder | Heating temperature (°C.) | Pressure (t/cm²) | Density (g/cm³) | Thermal conductivity (cal/cm · sec · °C.) | Coefficient of thermal expansion (×10⁻⁶/°C.) | Half-value width (°) Si (531) | Al (420) |
|---|---|---|---|---|---|---|---|
| A  | 565 | 3  | 2.44 | 0.30 | 8.5 | 0.52 | 0.37 |
| A* | 565 | 10 | 2.44 | 0.29 | 8.6 | 0.63 | 0.41 |
| A* | 540 | 3  | 2.35 | 0.24 | 8.8 | 0.55 | 0.39 |
| A* | 540 | 10 | 2.44 | 0.28 | 8.5 | 0.65 | 0.45 |
| B  | 565 | 3  | 2.44 | 0.30 | 8.6 | 0.51 | 0.37 |
| B* | 565 | 10 | 2.44 | 0.29 | 8.6 | 0.62 | 0.40 |
| B* | 540 | 3  | 2.35 | 0.24 | 8.8 | 0.55 | 0.38 |
| B* | 540 | 10 | 2.44 | 0.28 | 8.6 | 0 64 | 0.44 |

Note: Samples with * are Comparative Examples

As it is clear from Table 6, when the heating temperature is less than 550° C. or the forging pressure is 4 t/cm² or higher, the thermal conductivity becomes lower than 0.30 cal/cm.sec.° C. since the half value width of the silicon (531) peak is higher than 0.6° or the densification does not occur. It is possible to achieve a thermal conductivity of 0.3 cal/cm.sec.° C. or higher as well as a coefficient of thermal expansion be $12 \times 10^{-6}$/° C. or smaller and a density of 2.5 g/cm³ or lower by lowering the half value width of the silicon (531) peak to 0.6° or smaller in accordance with the process of the present invention.

TABLE 7

| Powder | Heating temperature (°C.) | Pressure (t/cm²) | Density (g/cm³) | Thermal conductivity (cal/cm · sec · °C.) | Coefficient of thermal expansion (×10⁻⁶/°C.) | Half-value width (°) Si (531) | Al (420) |
|---|---|---|---|---|---|---|---|
| A  | 540 | 1 | 2.44 | 0.31 | 8.6 | 0.42 | 0.35 |
| A  | 540 | 3 | 2.44 | 0.30 | 8.6 | 0.48 | 0.33 |
| A# | 540 | 1 | 2.44 | 0.32 | 8.5 | 0.39 | 0.30 |
| B  | 540 | 1 | 2.44 | 0.31 | 8.6 | 0.40 | 0.35 |
| B  | 540 | 3 | 2.44 | 0.30 | 8.6 | 0.46 | 0.33 |
| B# | 540 | 1 | 2.44 | 0.32 | 8.5 | 0.38 | 0.30 |

Note: #denotes samples sintered by applying pulse current.

As it is clear from Table 7, it is possible to consolidate under the conditions of 550° C. or lower and 4 t/cm² or lower which typically do not promote densification, by applying electrical current. The half value width is lowered by reducing the pressure applied when consolidation and the thermal conductivity rises. It was found possible to increase the thermal conductivity to 0.3 cal/cm.sec.° C. or higher and, at the same time, reduce the coefficient of thermal expansion to $12\times10^{-6}/°$ C. or smaller and the density to 2.5 g/cm$^3$ or lower by the process of the present invention. Especially, by using pulse current, densification is easily promoted, hence the half value width is reduced and the thermal conductivity is increased.

EXAMPLE 11

Each forged body produced under the conditions of a heating temperature of 565° C. and a forging pressure of 3 t/cm$^2$ or a heating temperature of 540° C. and a forging pressure 10 t/cm$^2$ in Example 9 was heat treated at 300° C. for 2 hours or at 500° C. for 0.5, 2, 4 and 8 hours.

The density, the thermal conductivity, the coefficient of thermal expansion and the half value width of the silicon (531) peak and the aluminum (420) peak at from 110° to 120° by X-ray (Cu-Kα1 ray: wavelength 1.5405 Å) diffraction of each heat treated body were measured in the same way as in Example 4 and the results are shown in Table 8 (heating temperature 540° C.×forging pressure 10 t/cm$^2$) and Table 9 (heating temperature 565° C.×forging pressure 3 t/cm$^2$).

one hour, the amount of distortion decreases so that the half value width of the silicon (531) peak is reduced to 0.6° or smaller and the thermal conductivity is increased to 0.3 cal/cm.sec.° C. or higher. Also from Table 9, it can be seen that the half value width of the silicon (531) peak is further reduced even for the samples with a half value width 0.6° or smaller by heat treatment and the thermal conductivity is raised to 0.32 cal/cm.sec.° C. or higher.

EXAMPLE 12

Molten aluminum-silicon alloys containing 45%, 50%, 60%, 70%, 80% and 85% by weight of silicon was powdered by water atomizing with a solidification rate of $10^{4°}$ C./sec and each aluminum-silicon alloy powder obtained was sieved to obtain a grain size of 40 μm or smaller.

Each powder obtained was molded into a tablet shaped test piece of 20 mm in diameter and 30 mm in height under a pressure of 4 t/cm$^2$ and a compact having a true density ratio of 72 to 78% was obtained. After each compact was heated to 565° C., it was consolidated by forging in a die heated at 500° C. under a bearing pressure of 3 t/cm$^2$. The density, thermal conductivity, coefficient of thermal expan-

TABLE 8

(Heating temperature 540° C. × Forging pressure 10 t/cm$^2$)

| Powder | Condition of heat treatment (°C. × hours) | Density (g/cm$^3$) | Thermal conductivity (cal/cm · sec · °C.) | Coefficient of thermal expansion (×10$^{-6}$/°C.) | Half-value width (°) Si (531) | Half-value width (°) Al (420) |
|---|---|---|---|---|---|---|
| A* | 300 × 2 | 2.44 | 0.28 | 8.6 | 0.65 | 0.45 |
| A* | 500 × 0.5 | 2.44 | 0.29 | 8.6 | 0.62 | 0.42 |
| A | 500 × 2 | 2.44 | 0.30 | 8.6 | 0.58 | 0.37 |
| A | 500 × 4 | 2.44 | 0.31 | 8.6 | 0.55 | 0.35 |
| A | 500 × 8 | 2.44 | 0.31 | 8.6 | 0.50 | 0.33 |
| B* | 300 × 2 | 2.44 | 0.28 | 8.6 | 0.65 | 0.44 |
| B* | 500 × 0.5 | 2.44 | 0.29 | 8.6 | 0.62 | 0.41 |
| B | 500 × 2 | 2.44 | 0.30 | 8.6 | 0.58 | 0.37 |
| B | 500 × 4 | 2.44 | 0.31 | 8.6 | 0.55 | 0.35 |
| B | 500 × 8 | 2.44 | 0.31 | 8.6 | 0.50 | 0.33 |

Note: Samples with * are Comparative Examples.

TABLE 9

(Heating temperature 565° C. × Forging pressure 3 t/cm$^2$)

| Powder | Condition of heat treatment (°C. × hours) | Density (g/cm$^3$) | Thermal conductivity (cal/cm · sec · °C.) | Coefficient of thermal expansion (×10$^{-6}$/°C.) | Half-value width (°) Si (531) | Half-value width (°) Al (420) |
|---|---|---|---|---|---|---|
| A* | 300 × 2 | 2.44 | 0.30 | 8.5 | 0.52 | 0.37 |
| A* | 500 × 0.5 | 2.44 | 0.31 | 8.5 | 0.51 | 0.37 |
| A | 500 × 2 | 2.44 | 0.32 | 8.5 | 0.50 | 0.36 |
| A | 500 × 4 | 2.44 | 0.33 | 8.5 | 0.46 | 0.35 |
| A | 500 × 8 | 2.44 | 0.33 | 8.5 | 0.44 | 0.34 |
| B* | 300 × 2 | 2.44 | 0.30 | 8.5 | 0.51 | 0.37 |
| B* | 500 × 0.5 | 2.44 | 0.31 | 8.5 | 0.50 | 0.37 |
| B | 500 × 2 | 2.44 | 0.32 | 8.5 | 0.50 | 0.36 |
| B | 500 × 4 | 2.44 | 0.33 | 8.5 | 0.46 | 0.35 |
| B | 500 × 8 | 2.44 | 0.33 | 8.5 | 0.43 | 0.34 |

Note: Samples with * are Comparative Examples.

As it is clear from Table 8, it can be understood that, as a result of the heat treatment at 400° C. or higher for at least sion and half value width of silicon (531) peak and aluminum (420) peak at 110° to 120° by X-ray (Cu-Kα1 ray:

wavelength 1.5405 Å) diffraction of each forged body were measured in the same way as in Example 4 and the results are shown in Table 10.

TABLE 10

| Sample | Si content (wt %) | Density (g/cm³) | Heat conductivity (cal/cm · sec · °C.) | Coefficient of thermal expansion (×10⁻⁶/°C.) | Half-value width (°) | |
|---|---|---|---|---|---|---|
| | | | | | Si (531) | Al (420) |
| 28 | 45 | 2.53 | 0.36 | 12.4 | 0.38 | 0.35 |
| 29 | 50 | 2.50 | 0.33 | 11.3 | 0.40 | 0.35 |
| 30 | 60 | 2.47 | 0.31 | 9.8 | 0.45 | 0.36 |
| 31 | 70 | 2.44 | 0.30 | 8.5 | 0.52 | 0.37 |
| 32 | 80 | 2.40 | 0.30 | 7.0 | 0.56 | 0.38 |
| 33* | 85 | Cracks occurred in the compact and testing thereafter was cancelled. | | | | |

Note: Samples with * are Comparative Examples.

As it is clear from Table 10, it is possible to obtain a thermal conductivity of 0.3 cal/cm.sec.° C. or higher, a coefficient of thermal expansion of $12 \times 10^{-6}/°$ C. or smaller and a density of 2.5 g/cm³ or lower by controlling the silicon content to 50% to 80% by weight.

EXAMPLE 13

A molten aluminum-silicon alloy containing 70% by weight of silicon was rapidly solidified by water atomizing at a solidification rate of $10^{4°}$ C./sec and the rapidly solidified aluminum-silicon alloy powder obtained was sieved to obtain a grain size of 40 μm or smaller. This alloy powder was molded into a tablet shaped test piece of 98 mm in diameter and 50 mm in height under a molding pressure of 2.5 t/cm² and a compact having a true density ratio of 74% was produced. This compact was consolidated by means of applying an electrical current under conditions of 5 V and 2000 A at a bearing pressure of 1 t/cm² to produce a forged body.

This forged body had a density of 2.44 g/cm³, a thermal conductivity of 0.31 cal/cm.sec.° C. and a coefficient of thermal expansion of $8.6 \times 10^{-6}/°$ C. This forged body was cut into a specified shape and used as a substrate for the IC packages shown in FIGS. 7–13. The structures of the IC packages in FIGS. 7–13 are the same as in the preceding Example 3 and hence their explanation is omitted here.

Distortion due to thermal stress was unlikely to occur during the IC mounting process since the difference in the coefficient of thermal expansion between the aluminum-silicon alloy of the present invention used as the substrate 1 in each of these IC packages and the main material for semiconductor chip 4 or the main material for the main package body 2 was small. Since the substrate 1 has a good heat releasing capability, these IC packages had a long life and a superb reliability. A heat resistance test at 200° C. for 15 minutes and a heat cycle test of 100 cycles within a temperature range of between −60° C. and +150° C. were carried out on each IC package and it was confirmed that no abnormality in performance occurred.

EXAMPLE 14

Figure 17:
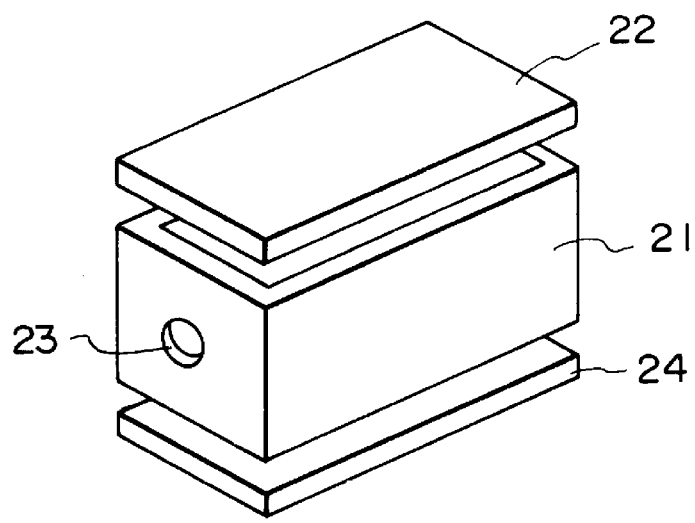
FIG. 17 is a schematic cross-sectional view showing another specific embodiment of a package for a microwave integrated circuit, having a substrate therein which is formed of the material for a semiconductor substrate according to the present invention.

A forged body prepared by an aluminum-silicon alloy containing 70% by weight of silicon produced by the same process as shown in FIG. 2 of Example 9 was used to produce a case 21 and a lid 22 of the package shown in FIG. 17. The material was plated with nickel after it was cut. The case 21 has a hole 23 for a lead terminal and a microwave integrated circuit substrate is to be mounted in the case 21.

Furthermore, by using a forged body composed of the inventive aluminum-silicon alloy containing 70% by weight of silicon as a base plate 24 in this package, a package with an increased reliability could be obtained since the difference in coefficient of thermal expansion between the alloy and silicon composing the microwave integrated circuit substrate was small compared to a case in which, for example, an aluminum-silicon alloy containing 40% by weight of silicon was used. Therefore, highly reliable packages especially with regard to airtightness for bonding and heat releasing capability were obtained even if the size of the substrate was doubled with respect to the length of the edge.

A heat resistance test at 200° C. for 15 minutes and a heat cycle test of 100 cycles within a temperature range between −60° C. and +150° C. were carried out on this package for this microwave integrated circuit. However, even after the tests, an airtightness of approximately $1 \times 10^{-10}$ cc/sec was maintained, the heat releasing capability was unchanged, no abnormality in the functions of the IC was confirmed, and no change in appearance was found.

From the above results of Examples 9 through 14, it is clear that according to the present invention, a material for a semiconductor substrate having the properties of density of 2.5 g/cm³ or lower, coefficient of thermal expansion of $12 \times 10^{-6}/°$ C. or smaller and thermal conductivity of 0.30 cal/cm.sec.° C. or higher can be obtained with an aluminum-silicon alloy containing from 50% to 80% by weight of silicon by reducing the half value width of the silicon (531) peak at from 110° to 120° by X-ray (Cu-Kα1 ray: wavelength 1.5405 Å) diffraction to 0.6° or smaller. Since this material for a semiconductor substrate has a low coefficient of thermal expansion and a high thermal conductivity while it is lightweight, it is a material suitable for, for example, such parts as a heat sink, a substrate for a semiconductor substrate, a heat release substrate and a housing.

EXAMPLE 15

Figure 18:
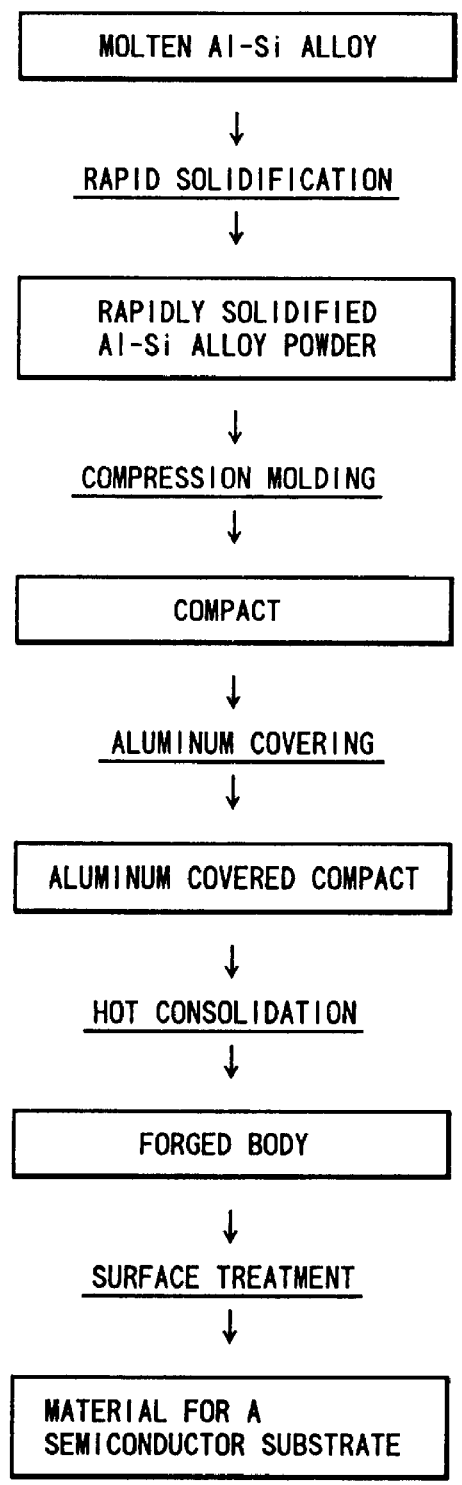
FIG. 18 is a flow diagram showing a process for producing a material for a semiconductor substrate of the present invention having an aluminum covering layer on the surface thereof.
Figure 19:
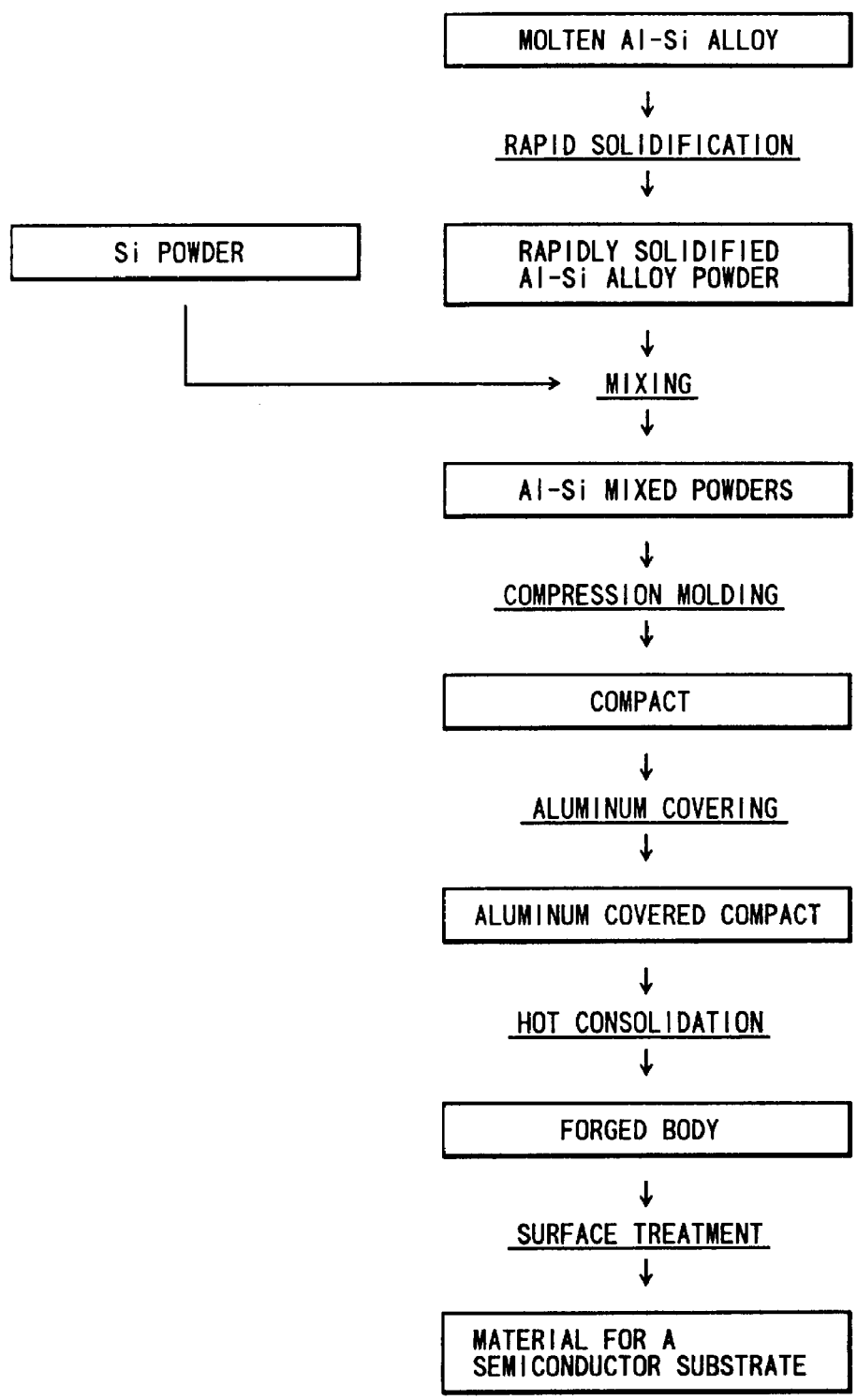
FIG. 19 is a flow diagram showing another process for producing a material for a semiconductor substrate of the present invention having an aluminum covering layer on the surface thereof

A material for a semiconductor substrate was produced in accordance with the production procedures shown in FIG. 18 and FIG. 19. First, following the procedure in FIG. 18, molten aluminum-silicon alloys containing 45, 50, 60, 70, 80 and 85% by weight of silicon were rapidly solidified by water atomizing to produce aluminum-silicon alloy powders. Each rapidly solidified aluminum-silicon alloy powder obtained was sieved to 40 μm or smaller.

Next, following the procedure in FIG. 19, a silicon powder with a maximum grain size of 40 μm and an average grain size of 10 μm was mixed with the rapidly solidified aluminum-silicon alloy powder (sieved to 40 μm or less) containing 40% by weight of silicon in the proportion of 10, 20, 30, 40, 50, 60 and 70% by weight as shown in Table 11 below to obtain each aluminum-silicon mixed powders. Mixing was done by putting alumina balls, each having a diameter of 1 cm, in an amount of 10 times the weight of the powders in a pot and rotating it for 1 hour. The powder production procedures in FIG. 18 and FIG. 19 correspond to the same procedures in FIG. 2 and FIG. 1 in the present invention.

Each of aluminum-silicon alloy powder and aluminum-silicon mixed powders obtained was molded into a bullet shaped test piece of 10 mm in diameter and 20 mm in height under a molding pressure of 4 t/cm². The true density ratio of each compact was 72% to 76%. Cracks occurred in the sample made from the rapidly solidified aluminum-silicon alloy powder containing 85% by weight of silicon and also in the sample made from the aluminum-silicon mixed powders containing 82% by weight of silicon which was made by adding 70% by weight silicon powders to the aluminum-silicon alloy powder to obtain an aluminum-silicon alloy powder containing a silicon content of 82% by weight.

Next, the entire surface of each compact was covered with aluminum foil of 50 μm in thickness. 15 compacts each covered with aluminum foil were prepared for each sample. After each compact was heated to 540° C., it was hot consolidated by forging using a forging die heated at 300° C. under a bearing pressure of 6 t/cm².

Each forged compact obtained composed of a main forged body of aluminum-silicon alloy and an aluminum covering layer of 50 μm in thickness. The density, thermal conductivity and coefficient of thermal expansion of each forged body were measured and the average values for each sample are shown in Table 11 and Table 12. Table 11 shows the results of each sample produced according to the procedure in FIG. 18 and Table 12 shows the results of each sample produced according to the procedure in FIG. 19. The density was obtained by the Archimedean process and the thermal conductivity by the laser flash process. The coefficient of thermal expansion was obtained by averaging the values obtained by the push rod process at from 20° to 200° C.

TABLE 11

| Sample | Si content in alloy (wt %) | Density (g/cm³) | Thermal conductivity (cal/ · sec · cm° · C.) | Coefficient of thermal expansion (×10⁻⁶/°C.) |
|---|---|---|---|---|
| 34* | 45 | 2.53 | 0.35 | 12.4 |
| 35 | 50 | 2.50 | 0.32 | 11.3 |
| 36 | 60 | 2.47 | 0.30 | 9.8 |
| 37 | 70 | 2.44 | 0.29 | 8.6 |
| 38 | 80 | 2.40 | 0.28 | 7.0 |
| 39* | 85 | Cracks occurred in the compact and testing thereafter was cancelled. | | |

Note: Samples with * are Comparative Examples

TABLE 12

| Sample | Si powder content (wt %) | Si content in alloy (wt %) | Density (g/cm³) | Thermal conductivity (cal/sec · °C. · cm) | Coefficient of thermal expansion (×10⁻⁶/°C.) |
|---|---|---|---|---|---|
| 40* | 10 | 46 | 2.53 | 0.34 | 12.2 |
| 41 | 20 | 52 | 2.50 | 0.31 | 10.9 |
| 42 | 30 | 58 | 2.48 | 0.30 | 10.0 |
| 43 | 40 | 64 | 2.45 | 0.29 | 9.4 |
| 44 | 50 | 70 | 2.44 | 0.29 | 8.6 |
| 45 | 60 | 76 | 2.42 | 0.28 | 7.6 |
| 46* | 70 | 82 | Cracks occurred in the compact and testing thereafter was cancelled. | | |

Note: Samples with * are Comparative Examples.

As it is clear from the above results, it is possible to obtain a material for a semiconductor substrate having an aluminum covering layer on its surface and having the properties of density 2.5 g/cm³ or lower, coefficient of thermal expansion 6–12×10⁻⁶/° C. or smaller and thermal conductivity 0.28 cal/cm.sec.° C. or higher by limiting the amount of silicon content in an aluminum-silicon alloy constituting the main body of the forged body between 50% and 80% by weight.

EXAMPLE 16

By the same processes as in Example 15, the aluminum-silicon alloy powder containing 60% by weight of silicon (Sample 36 of Example 15) and the aluminum-silicon mixed powders (Sample 42 of Example 15) made by adding 30% by weight of silicon powder to the aluminum-silicon alloy powder containing 40% by weight of silicon were used to produce compacts. The entire surface of each compact obtained was covered with an aluminum foil of thickness 3, 5, 50, 500 and 600 μm as shown in Table 13 and Table 14.

Each compact covered with the aluminum foil was forged in the same way as in Example 15 and a forged body constituted of a main body made of the aluminum-silicon alloy and the aluminum coating layer (the same thickness as the aluminum foil) formed on the entire surface of the main body was obtained. Also for comparison, compacts not covered with aluminum foil was also forged to produce forged bodies in the same manner.

Each forged body received an alumite treatment in a sulfuric acid bath at a current density of 1.5 A/dm² and was further boiled in ion-exchange water for sealing treatment. Alternatively, each of the other forged compacts received an aluminum etching treatment in an alkali liquid for 1 minute, then its surface was treated with a zinc substitution process and furthermore treated with electroless nickel-phosphorus plating.

For each semiconductor substrate material of each sample obtained, a heat resistance test where it was left in atmosphere of 450° C. for 30 minutes and a salt spray test where a neutral salt water of 5% in concentration heated at 35° C. was sprayed for 48 hours were conducted to evaluate its corrosion resistance. The results of alumite treatment are shown in Table 13 and those of plating treatment are shown in Table 14.

In Tables 13 and 14 and also in other tables, the symbol "O" is used to represent "excellent or good results.

TABLE 13

Corrosion resistance by alumite treatment

| Sample | Aluminum foil thickness (μm) | Evaluation by heat resistance test | Evaluation by salt spray test |
|---|---|---|---|
| 36-1* | none | blistering, peeling | staining |
| 36-2* | 3 | blistering, peeling | staining |
| 36-3 | 5 | O | O |
| 36-4 | 50 | O | O |
| 36-5 | 500 | O | O |
| 36-6* | 600 | warping | O |
| 42-1* | none | blistering, peeling | staining |
| 42-2* | 3 | blistering, peeling | staining |
| 42-3 | 5 | O | O |
| 42-4 | 50 | O | O |
| 42-5 | 500 | O | O |
| 42-6* | 600 | warping | O |

Note: Samples with * are Comparative Examples

TABLE 14

Corrosion resistance by plating treatment

| Sample | Aluminum foil thickness (μm) | Evaluation by heat resistance test | Evaluation by salt spray test |
|---|---|---|---|
| 36-1* | none | blistering, peeling | staining |
| 36-2* | 3 | blistering, peeling | staining |
| 36-3 | 5 | O | O |
| 36-4 | 50 | O | O |
| 36-5 | 500 | O | O |
| 36-6* | 600 | warping | O |
| 42-1* | none | blistering, peeling | staining |
| 42-2* | 3 | blistering, peeling | staining |
| 42-3 | 5 | O | O |
| 42-4 | 50 | O | O |
| 42-5 | 500 | O | O |
| 42-6* | 600 | warping | O |

Note: Samples with * are Comparative Examples

From the above results, it is clear that the materials for a semiconductor substrate of the present invention having an alumite layer or a plating layer over an aluminum covering layer of 5 μm to 500 μm in thickness have a good corrosion resistance. However, when the thickness of the aluminum covering layer was less than 5 μm, sufficient corrosion resistance could not be obtained and, on the other hand, when the thickness of the aluminum coating layer was more than 500 μm, warping occurred after the heat resistance test was carried out.

EXAMPLE 17

According to the same procedures as in Example 15, an aluminum-silicon alloy powder containing 60% by weight of silicon (Sample 36 in Example 15) and an aluminum-silicon mixed powders (Sample 42 in Example 15) made by adding 30% by weight of silicon powder to an aluminum-silicon alloy powder containing 40% by weight of silicon, were molded into compacts.

Aluminum powder dispersed in an organic solvent was applied in a thickness of 100 μm to each compact by dipping (Samples 36-7 and 42-7), aluminum powder was applied by spray coating using inert gas in a thickness of 100 μm to each compact (Samples 36-8 and 42-8), aluminum powder dispersed in an organic binder was applied in a thickness of 100 μm onto each compact by printing (Samples 36-9 and 42-9) and aluminum was applied in a thickness of 100 μm onto each compact by vapor phase deposition using the plasma process (Samples 36-10 and 42-10) to each compact.

Each compact having such a precursory aluminum layer was forged by the same process as in Example 15 and the resultant forged body constituted of each aluminum-silicon alloy having an aluminum coating layer on its entire surface was produced. Each forged body obtained was subjected to alumite treatment in a sulfuric acid bath with a current density of 1.5 A/dm² and was further boiled in ion-exchange water for sealing treatment. Each of the other forged compacts received an aluminum etching treatment in an alkali liquid for 1 minute, then its surface was substituted by zinc and further treated with electroless nickel-phosphorus plating.

For the semiconductor substrate material of each sample obtained as above, a heat resistance test in which each material was kept at 450° C. for 30 minutes in the air and a salt spray test where a 35° C. neutral salt water of 5% in concentration was sprayed for 48 hours were carried out to evaluate the corrosion resistance of each material. The results of the alumite treatment are shown in Table 15 and the results of the plating treatment are shown in Table 16. It is clear from the results shown in the Tables that the semiconductor substrate material of the present invention having an alumite layer or a plating layer over aluminum coating layer formed by any of the above processes, has a good corrosion resistance.

TABLE 15

Corrosion resistance by alumite treatment

| Sample | Evaluation by heat resistance test | Evaluation by salt spray test |
| --- | --- | --- |
| 36-7 | O | O |
| 36-8 | O | O |
| 36-9 | O | O |
| 36-10 | O | O |
| 42-7 | O | O |
| 42-8 | O | O |
| 42-9 | O | O |
| 42-10 | O | O |

TABLE 16

Corrosion resistance by plating treatment

| Sample | Evaluation by heat resistance test | Evaluation by salt spray test |
| --- | --- | --- |
| 36-7 | O | O |
| 36-8 | O | O |
| 36-9 | O | O |
| 36-10 | O | O |
| 42-7 | O | O |
| 42-8 | O | O |
| 42-9 | O | O |
| 42-10 | O | O |

EXAMPLE 18

By the same process as in Example 15, an aluminum-silicon alloy powder containing 60% by weight of silicon (Sample 36 in Example 15) and aluminum-silicon mixed powders made by adding 30% by weight of silicon powder to an aluminum-silicon alloy powder containing 40% by weight of silicon (Sample 42 in Example 15) were molded into compacts.

Onto each compact, $Al_2O_3$ powder dispersed in an organic solvent was applied by dipping to form a layer of 100 µm in thickness (Samples 36-11 and 42-11), $Al_2O_3$ powder dispersed in molten aluminum was applied by spray coating using an inert gas to form a layer of 100 µm in thick (Samples 36-12 and 42-12), $Al_2O_3$ powder dispersed in an organic binder was applied by printing to form a layer of 100 µm in thickness (Sample 36-13 and 42-13) and $Al_2O_3$ was applied by vapor phase deposition using the plasma CVD process to form a layer of 100 µm in thickness (Samples 36-14 and 42-14) to each compact.

Each compact having an $Al_2O_3$ layer on its surface was forged as in Example 15 and a forged body comprising an aluminum-silicon alloy and an $Al_2O_3$ insulating layer (100 µm in thickness) over the entire surface was produced. For the semiconductor substrate material of each sample obtained as above, a heat resistance test in which it was kept in the air at 450° C. for 30 minutes and a salt spray test in which a 35° C. neutral salt water of 5% in concentration was sprayed for 48 hours were conducted to evaluate its corrosion resistance and the results are shown in Table 17. It is clear from Table 17 that the semiconductor substrate material of the present invention having an insulating layer formed by any of the processes has a high corrosion resistance.

TABLE 17

Corrosion resistance by insulating layer

| Sample | Evaluation by heat resistance test | Evaluation by salt spray test |
| --- | --- | --- |
| 36-11 | O | O |
| 36-12 | O | O |
| 36-13 | O | O |
| 36-14 | O | O |
| 42-11 | O | O |
| 42-12 | O | O |
| 42-13 | O | O |
| 42-14 | O | O |

EXAMPLE 19

Each IC package shown in FIGS. 7 and 8 will be explained as an example of application of the semiconductor substrate material of the present invention having an alumite layer or a plating layer on its surface. First, a molten aluminum-silicon alloy containing 60% by weight of silicon was rapidly solidified by water atomizing to produce rapidly solidified aluminum-silicon alloy powder. The rapidly solidified aluminum-silicon alloy powder obtained was sieved to 40 µm or smaller.

The aluminum-silicon alloy powder obtained was compression molded under a molding pressure of 2.5 t/cm² to form a compact of 30 mm×30 mm with a true density ratio of about 74%. Next, the entire surface of this compact was covered with an aluminum foil of 100 µm in thickness. After this compact was heated to 540° C., it was hot consolidated by forging using a forging die of the desired shape heated at 300° C. under a bearing pressure of 6 t/cm².

The forged compact obtained was composed of the main forged compact body made of the Al—Si alloy and the aluminum covering layer of 100 µm in thickness formed over the entire surface of the main body and had a density of 2.47 g/cm³, a coefficient of thermal expansion of 9.8× $10^{-6}$/° C. and a thermal conductivity of 0.30 cal/cm.sec.° C.

One sample made of the above forged compact was subjected to an alumite treatment in a sulfuric acid bath with a current density of 1.5 A/dm² and was further boiled in ion-exchange water for sealing treatment to be used as a semiconductor substrate material. Another one of the same forged compact was subjected to an aluminum etching treatment in an alkali liquid for one minute, then its surface was treated with a zincate conversion process and further treated with electroless nickel-phosphorus plating to be made into another semiconductor substrate material.

The substrate 1 in the package in FIG. 7 is composed of the semiconductor substrate material with the above alumite treatment, that is the semiconductor substrate material of the aluminum-silicon alloy covered with the aluminum covering layer which has an alumite layer on its outermost surface. The substrate 1 in the package in FIG. 8 is different from the one in FIG. 7 and this substrate comprises the material for a semiconductor substrate with the above plating treatment, that is the material for a semiconductor substrate consisting of an aluminum-silicon alloy covered with an aluminum covering layer which has a nickel-phosphorus plating layer on its outermost surface. Explanation of the other structures are the same as in Example 3 and hence it is omitted here.

In the material for a semiconductor substrate of the present invention which is used in substrate 1 in FIG. 7 or FIG. 8, distortion due to thermal stress is unlikely to occur during the mounting process, since the difference in coefficient of thermal expansion between the substrate material of the present invention and other material, such as silicon, which is the main material for the semiconductor chip 4, or alumina, which is the main material for the main package body 2, is small, as mentioned previously. Also, the material for a semiconductor substrate of the present invention has a high thermal conductivity which contributes to the good heat releasing capability of the substrate 1, and hence an IC package with a long life and a superb reliability can be obtained.

Also, the surface of the substrate 1 has a superb corrosion resistance since it has an alumite layer or a plating layer. A heat resistance test at 200° C. for 15 minutes and a heat cycle test of 100 cycles within the temperature range of from −60° to +150° C. were carried out on these packages but no abnormality in performance occurred and no change in appearance was confirmed.

EXAMPLE 20

Following the same processes used in Example 19 above, a material for a semiconductor substrate made of an aluminum-silicon alloy, which contained 60% by weight of silicon and had an aluminum covering layer on its surface and further a nickel plating layer on the surface of the aluminum covering layer, was produced.

This semiconductor substrate material was used to produce the base plate 24 of the package shown in FIG. 17 and a material made of the aluminum-silicon alloy containing 40% by weight of silicon with its surface directly plated with nickel was used to produce the case 21 and the lid 22. The case 21 had a hole 23 for a lead terminal and a microwave integrated circuit is to be mounted on the base plate 24.

By using this substrate material consisting substantially of the aluminum-silicon alloy containing 60% by weight of silicon for the base plate 24 as above, the reliability was improved and the size of the substrate could be doubled, since the difference in coefficient of thermal expansion between the material and silicon composing the microwave integrated circuit was small as compared to, for example, a case in which an aluminum-silicon alloy containing 40% by weight of silicon was used.

A heat resistance test at 200° C. for 15 minutes and a heat cycle test of 100 cycles within the temperature range of −60° to +150° C. were carried out on this package for a microwave integrated circuit but no abnormality in performance occurred and no change in appearance was confirmed.

As explained in the above Examples 15 through 20, it is possible to provide a material for a semiconductor substrate that satisfies the required properties, i.e., a density of 2.5 g/cm³ or lower; a coefficient of thermal expansion of 6-12× $10^{-6}$/° C. and a thermal conductivity of 0.28 cal/cm.sec.°C. or higher, and, at the same time, is successfully subjected to an alumite treatment or plating treatment for superb corrosion resistance, by using an aluminum-silicon alloy of the present invention having an aluminum covering layer on its surface. This material for a semiconductor substrate is also suitable for use especially in portable devices and in the industry of spacecraft technology since while it is lightweight, it has a high thermal conductivity and a low coefficient of thermal expansion, and also has a superb durability against environmental factors.

According to the present invention, rapidly solidified aluminum-silicon alloy powder with few coarse silicon crystals, little oxygen and few impurities can be obtained from a molten aluminum-silicon alloy containing from 50% to 80% by weight of silicon, and, by using this aluminum-silicon alloy powder, it is possible to produce a material for a semiconductor substrate, at low cost and high productivity, satisfying the required properties, i.e., a density of 2.5 g/cm³ or lower, a coefficient of thermal expansion of 12×$10^{-6}$/° C. or smaller and the thermal conductivity 0.28 cal/cm.sec.° C. or higher.

Therefore, the present invention is capable of providing a material for a semiconductor substrate at low cost and with high thermal conductivity and low coefficient of thermal expansion, that is suitable for example, a heat sink, a substrate for mounting a semiconductor, a heat release substrate, a housing, etc., and, furthermore, since it is lightweight, it is also capable of providing a material for a semiconductor substrate suitable for use in portable devices and in the field of spacecraft technology.

Also, according to the present invention, it is possible to provide a material for a semiconductor substrate which is composed of a lightweight aluminum-silicon alloy with high thermal conductivity and low coefficient of thermal expansion and which is capable of having a surface treatment such as an alumite treatment or a plating treatment for corrosion resistance, insulating property and brazing capability.

A material for a semiconductor substrate equipped with an aluminum covering layer on its surface can be obtained by such processes as forging after the surface of the compact made of the aluminum-silicon alloy is covered with aluminum foil. Corrosion resistance, insulating property and brazablity can be imparted to this substrate material by performing a surface treatment such as an alumite treatment or a plating treatment to the aluminum coating layer.

What is claimed is:

1. A material for a semiconductor substrate having a thermal conductivity of 0.28 to 0.33 cal/cm.sec.° C., a coefficient of thermal expansion of 6.6 to 11.3×$10^{-6}$/° C. and a density of 2.40 to 2.5 g/cm³, said material comprising an aluminum-silicon alloy containing from 50% to 80% by weight of silicon.

2. A material for a semiconductor substrate as claimed in claim 1, wherein half value width of the peak of Si (531) found between 110° and 120° by an X-ray diffraction with a Cu-Kα1 ray is 0.6° or smaller.

3. A material for a semiconductor substrate as claimed in claim 1, wherein the half value width of the peak of Al (420) found between 110° and 120° by the X-ray diffraction with a Cu-Kα1 ray is 0.5° or smaller.

4. A material for a semiconductor substrate as claimed in claim 2, wherein half value width of the peak of Al (420) found between 110° and 120° by an X-ray diffraction with a Cu-Kα1 ray is 0.5° or smaller.

5. A material of claim 1 for a semiconductor substrate wherein said material has an aluminum covering layer comprising aluminum or an aluminum alloy formed on at least one surface of the aluminum-silicon alloy, the aluminum covering layer having a thickness of 5–500 μm.

6. A material for a semiconductor substrate as claimed in claim 5, wherein the aluminum covering layer has an insulating layer formed on the outermost surface of the aluminum covering layer.

7. A material for a semiconductor substrate as claimed in claim 6, wherein the insulating layer is an alumite layer.

8. A material for a semiconductor substrate as claimed in claim 5, wherein the aluminum covering layer has a plating layer formed on the outermost surface of the aluminum covering layer.

9. A semiconductor device using a material for a semiconductor substrate having a thermal conductivity of 0.28 to 0.33 cal/cm.sec.° C., a coefficient of thermal expansion of 6.6. to 11.3×10$^{-6}$/° C. and a density of 2.40 to 2.5 g/cm$^3$, said material comprising an aluminum-silicon alloy containing from 50% to 80% by weight of silicon.

10. A semiconductor device using a material for a semiconductor substrate having a thermal conductivity of 0.28 to 0.33 cal/cm.sec.° C., a coefficient of thermal expansion of 6.6 to 11.3×10$^{-6}$/° C. and a density of 2.40 to 2.5 g/cm$^3$, said material comprising an aluminum-silicon alloy containing from 50% to 80% by weight of silicon, said material having an aluminum covering layer comprising aluminum or an aluminum alloy formed on a least one surface of the aluminum-silicon alloy, the aluminum covering layer having a thickness of 5–500 μm.

11. A process for producing a material of claim 1 comprising:
providing a molten aluminum-silicon alloy containing 50% or less by weight of silicon;
rapidly solidifying the molten alloy by atomization to form a rapidly solidified aluminum-silicon alloy powders;
adding and mixing silicon powder to and with the aluminum-silicon alloy powder to provide mixed powder containing from 50 to 80% by weight of silicon;
compression molding the resultant mixed powders to form a compact; and
consolidating the compact to provide a consolidated body.

12. A process as claimed in claim 11, wherein the solidification rate when said rapid solidifying is 10$^{2°}$ C./sec or higher.

13. A process for producing a material of claim 1 comprising:
providing a molten aluminum-silicon alloy containing 50–80% by weight of silicon;
rapidly solidifying the molten alloy by atomization to form a rapidly solidified aluminum-silicon alloy powder;
compression molding the aluminum-silicon alloy powder to form a compact; and
consolidating the compact to provide a consolidated body.

14. A process as claimed in claim 13, wherein the solidification rate when said rapid solidifying is higher than 10$^{3°}$ C./sec.

15. A process as claimed in claim 13, wherein the molten alloy is rapidly solidified through water atomization and is dried at a temperature lower than 100° C. into the aluminum-silicon alloy powder.

16. A process as claimed in claim 14, wherein the molten alloy is rapidly solidified through water atomization and is dried at a temperature lower than 100° C. into the aluminum-silicon alloy powder.

17. A process as claimed in claim 11, wherein the grain size of Si contained in the rapidly solidified Al—Si alloy powder is 30 μm or smaller.

18. A process as claimed in claim 13, wherein the grain size of Si contained in the rapidly solidified Al—Si alloy powder is 30 μm or smaller.

19. A process as claimed in claim 11, wherein the amount of oxygen in the rapidly solidified Al—Si alloy powder is 1% or smaller by weight.

20. A process as claimed in claim 13, wherein the amount of oxygen in the rapidly solidified Al—Si alloy powder is 1% or smaller by weight.

21. A process as claimed in claim 11, wherein the amount of impurities other than oxygen in the rapidly solidified Al—Si alloy powder is 1% or smaller by weight.

22. A process as claimed in claim 13, wherein the amount of impurities other than oxygen in the rapidly solidified Al—Si alloy powder is 1% or smaller by weight.

23. A process as claimed in claim 11, wherein said consolidating of the compact is conducted by forging a pre-heated compact using a heated die.

24. A process as claimed in claim 13, wherein said consolidating of the compact is conducted by forging a pre-heated compact using a heated die.

25. A process as claimed in claim 23, wherein said forging is conducted under the conditions of at a compact heating temperature of 400° C. or higher, a die heating temperature of 150° C. or higher, and a forging pressure of 4 t/cm$^2$ or higher.

26. A process as claimed in claim 24, wherein said forging is conducted under the conditions of a compact heating temperature of 400° C. or higher, a die heating temperature of 150° C. or higher, and a forging pressure of 4 t/cm$^2$ or higher.

27. A process as claimed in claim 23, wherein said forging is conducted under the conditions of a compact heating temperature of 550° C. or higher, a die heating temperature of 300° C. or higher, and a forging pressure of lower than 4 t/cm$^2$.

28. A process as claimed in claim 24, wherein said forging is conducted under the conditions of a compact heating temperature of 550° C. or higher, a die heating temperature of 300° C. or higher, and a forging pressure of lower than 4 t/cm$^2$.

29. A process as claimed in claim 11, wherein said consolidating of the compact is conducted by sintering the compact in a nitrogen atmosphere at a temperature of from 500° to 570° C.

30. A process as claimed in claim 13, wherein said consolidating of the compact is conducted by sintering the compact in a nitrogen atmosphere at a temperature of from 500° to 570° C.

31. A process as claimed in claim 11, wherein said consolidating of the compact is conducted by electrically heating the compact placed within a die at a pressure below 4 t/cm$^2$.

32. A process as claimed in claim 13, wherein said consolidating of the compact is conducted by electrically heating the compact placed within a die at a pressure below 4 t/cm$^2$.

33. A process as claimed in claim 31, wherein said electrical heating is conducted by using pulse current.

34. A process as claimed in claim 32, wherein said electrical heating is conducted by using pulse current.

35. A process as claimed in claim 11, wherein the consolidated body is subjected to heat treating at a temperature of 400° C. or higher for at least one hour after consolidating.

36. A process as claimed in claim 13, wherein the consolidated body is subjected to heat treating at a temperature of 400° C. or higher for at least one hour after the consolidation of the compact.

37. A process for producing a material of claim 5 comprising:
providing a molten aluminum-silicon alloy containing 50% or less by weight of silicon;
rapidly solidifying the molten alloy by atomization to form a rapidly solidified aluminum-silicon alloy powder;
adding and mixing silicon powder to and with the aluminum-silicon alloy powder to provide mixed powders containing from 50% to 80% by weight of silicon;
compression molding the resultant mixed powders to form a compact, in which a precursor layer is disposed so as to cover at least one surface of the compact to be formed, the precursor layer being to be served as the aluminum covering layer in the subsequent consolidation; and consolidating the resultant compact to provide a consolidated body having the aluminum covering layer on at least one surface of the consolidated body.

38. A process for producing a material of claim 5 comprising:

providing a molten aluminum-silicon alloy containing 50–80% by weight of silicon;

rapidly solidifying the molten alloy by atomization to form a rapidly solidified aluminum-silicon alloy powder;

compression molding the resultant powders to form a compact, in which a precursor layer is disposed so as to cover at least one surface of the compact to be formed, the precursor layer being to be served as the aluminum covering layer in the subsequent consolidation; and consolidating the resultant compact to provide a consolidated body having the aluminum covering layer on at least one surface thereof.

39. A process for producing a material of claim 5 comprising:

providing a molten aluminum-silicon alloy containing 50% or less by weight of silicon;

rapidly solidifying the molten alloy by atomization to form a rapidly solidified aluminum-silicon alloy powder;

adding and mixing silicon powder to and with the aluminum-silicon alloy powder to provide mixed powders containing from 50 to 80% by weight of silicon;

compression molding the resultant mixed powders to form a compact; and consolidating the compact to provide a consolidated body; and forming the aluminum covering layer on at least one surface of the consolidated body.

40. A process for producing a material of claim 5 comprising:

providing a molten aluminum-silicon alloy containing 50–80% by weight of silicon;

rapidly solidifying the molten alloy by atomization to form a rapidly solidified aluminum-silicon alloy powder;

compression molding the aluminum-silicon alloy powder to form a compact; and consolidating the compact to provide a consolidated body; and forming the aluminum covering layer on at least one surface of the consolidated body.

41. A process as claimed in claim 37 wherein the thickness of the aluminum covering layer is from 5 to 500 µm.

42. A process as claimed in claim 38 wherein the thickness of the aluminum covering layer is from 5 to 500 µm.

43. A process as claimed in claim 39 wherein the thickness of the aluminum covering layer is from 5 to 500 µm.

44. A process as claimed in claim 40 wherein the thickness of the aluminum covering layer is from 5 to 500 µm.

45. A process as claimed in claim 37 wherein the precursor layer is formed of an aluminum foil or an aluminum alloy foil, or powder of aluminum or an aluminum alloy.

46. A process as claimed in claim 38 wherein the precursor layer is formed of an aluminum foil or an aluminum alloy foil, or powder of aluminum or an aluminum alloy.

47. A process as claimed in claim 39 wherein the aluminum covering layer is formed by means of dip coating, spray coating, printing or vapor deposition.

48. A process as claimed in claim 40 wherein the aluminum coating layer is formed by means of dip coating, spray coating, printing or vapor deposition.

49. A process as claimed in claim 37, wherein the process further comprises forming an insulating layer on the outermost surface of the aluminum covering layer.

50. A process as claimed in claim 38, wherein the process further comprises forming an insulating layer on the outermost surface of the aluminum covering layer.

51. A process as claimed in claim 39, wherein the process further comprises forming an insulating layer on the outermost surface of the aluminum covering layer.

52. A process as claimed in claim 40, wherein the process further comprises forming an insulating layer on the outermost surface of the aluminum covering layer.

53. A process as claimed in claim 49 wherein the insulating layer is formed by means of anodizing, dip coating, spray coating, printing or vapor deposition.

54. A process as claimed in claim 50 wherein the insulating layer is formed by means of anodizing, dip coating, spray coating, printing or vapor deposition.

55. A process as claimed in claim 51 wherein the insulating layer is formed by means of anodizing, dip coating, spray coating, printing or vapor deposition.

56. A process as claimed in claim 52 wherein the insulating layer is formed by means of anodizing, dip coating, spray coating, printing or vapor deposition.

57. A process as claimed in claim 37, wherein the process further comprises forming a plating layer on the outermost surface of the aluminum covering layer.

58. A process as claimed in claim 38, wherein the process further comprises forming a plating layer on the outermost surface of the aluminum covering layer.

59. A process as claimed in claim 39, wherein the process further comprises forming a plating layer on the outermost surface of the aluminum covering layer.

60. A process as claimed in claim 40, wherein the process further comprises forming a plating layer on the outermost surface of the aluminum covering layer.

* * * * *